United States Patent
Sato et al.

(10) Patent No.: US 8,004,173 B2
(45) Date of Patent: Aug. 23, 2011

(54) ANTISTATIC FILM, SPACER USING IT AND PICTURE DISPLAY UNIT

(75) Inventors: Toru Sato, Ebina (JP); Yasushi Shimizu, Fujisawa (JP); Noriaki Oguri, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 643 days.

(21) Appl. No.: 11/038,159

(22) Filed: Jan. 21, 2005

(65) Prior Publication Data

US 2005/0227062 A1   Oct. 13, 2005

(30) Foreign Application Priority Data

Jan. 22, 2004   (JP) ................................. 2004-014469

(51) Int. Cl.
  *H01J 1/62* (2006.01)
(52) U.S. Cl. ......... 313/495; 313/238; 313/259; 313/268
(58) Field of Classification Search .......... 313/495–497, 313/238, 240, 250, 257–259, 268, 288
  See application file for complete search history.

(56) References Cited

U.S. PATENT DOCUMENTS

| | | | |
|---|---|---|---|
| 5,270,263 A | 12/1993 | Kim et al. ...................... | 437/228 |
| 5,827,630 A | 10/1998 | Eichorst et al. ................. | 430/63 |
| 6,329,275 B1 | 12/2001 | Ishigami et al. .............. | 438/584 |
| 6,494,757 B2 | 12/2002 | Yamazaki et al. .............. | 445/24 |
| 6,656,007 B2 | 12/2003 | Fushimi et al. ................ | 445/24 |
| 6,927,533 B1 * | 8/2005 | Ito et al. ........................ | 313/495 |
| 2002/0008454 A1 | 1/2002 | Ishiwata et al. ............... | 313/310 |
| 2002/0047108 A1 * | 4/2002 | Yukinobu et al. ............. | 252/500 |
| 2002/0123292 A1 | 9/2002 | Yamazaki et al. .............. | 445/24 |
| 2003/0003838 A1 | 1/2003 | Yamazaki et al. .............. | 445/24 |
| 2003/0045199 A1 * | 3/2003 | Ito et al. .......................... | 445/24 |
| 2003/0048067 A1 | 3/2003 | Lee et al. ....................... | 313/479 |
| 2003/0052000 A1 | 3/2003 | Segal et al. ............. | 204/298.13 |
| 2004/0016914 A1 | 1/2004 | Matsuda et al. .............. | 252/500 |
| 2004/0058147 A1 | 3/2004 | Ozawa et al. .................. | 428/325 |
| 2005/0062401 A1 | 3/2005 | Shimizu ........................ | 313/495 |

FOREIGN PATENT DOCUMENTS

| | | |
|---|---|---|
| CN | 1334297 A | 2/2002 |
| CN | 1432070 A | 7/2003 |
| CN | 1435860 A | 8/2003 |
| EP | 0 991 102 A1 | 4/2000 |
| EP | 1 147 886 A2 | 10/2001 |
| EP | 1 203 788 A1 | 5/2002 |
| EP | 1 323 804 A1 | 7/2003 |
| JP | 5-323102 | 12/1993 |

(Continued)

OTHER PUBLICATIONS

Machine translation of jp10284283.*

(Continued)

*Primary Examiner* — Bumsuk Won
(74) *Attorney, Agent, or Firm* — Fitzpatrick, Cella, Harper & Scinto

(57) ABSTRACT

An antistatic film installed in an airtight vessel containing an electron source of an electron-generating device such as a picture display unit has a structure comprising an image of conductor or semiconductor particles with particle diameters of 0.5 to 10 nm dispersed in a medium containing a nitride, an oxide or both; and thereby improves controllability for a resistivity value, stability and reproducibility, and the adequate temperature characteristics of resistance.

35 Claims, 6 Drawing Sheets

FOREIGN PATENT DOCUMENTS

| | | |
|---|---|---|
| JP | 10-188352 | 7/1998 |
| JP | 10-283955 | 10/1998 |
| JP | 10-284283 | 10/1998 |
| JP | 10-284283 A | 10/1998 |
| JP | 10-284285 | 10/1998 |
| JP | 10-284286 | 10/1998 |
| JP | 10284283 | 10/1998 |
| JP | 2000-311609 | 11/2000 |
| JP | 2000-319470 | 11/2000 |
| JP | 2001-68042 | 3/2001 |
| JP | 2001-143620 | 5/2001 |
| WO | WO 01/42522 A2 | 6/2001 |
| WO | WO 03/006701 A1 | 1/2003 |

OTHER PUBLICATIONS

Korean Official Communication dated Oct. 15, 2007.

Chinese Notification of Second Office Action dated May 30, 2008, regarding Application No. 200510005621X.

Chinese Notification of First Office Action dated Jun. 26, 2009, regarding Application No. 2007101994654.

European Office Action issued by the European Patent Office in European Application No. 08 162 367.0-2208 (5 pages).

* cited by examiner

ANTISTATIC FILM, SPACER USING IT AND PICTURE DISPLAY UNIT

BACKGROUND OF THE INVENTION

1. Field of the Invention

The present invention relates to an antistatic film installed in an airtight vessel containing an electron source of an electron-generating device such as a picture display unit, to a spacer using such film, and to the picture display unit.

2. Related Background Art

A flat display unit using an electron-emitting device has, as shown in Japanese Patent Application Laid-Open No. H10-284286, a spacer, also called a rib, installed therein, which serves as a structural support resistant to ambient pressure for keeping the inside of the unit at a high vacuum.

FIG. 7 is a cross-sectional schematic view of an image-forming apparatus using many electron-emitting devices. Reference numeral 101 denotes a rear plate, reference numeral 102 a sidewall and reference numeral 103 a faceplate, and an airtight vessel is formed by the rear plate 101, the side wall 102 and the face plate 103. A spacer 107b that is a structural support resistant to ambient pressure in the airtight vessel has a low-resistivity film 110 thereon, and is connected to wiring 109 through an electroconductive frit 108.

An electron-emitting device 104 is formed on a rear plate 101, and a phosphor 105 and a metal back 106 are formed on a face plate. The objects of providing a metal back 106 include: to improve a utilization factor of light by minor-reflecting a light emitted from a phosphor 105; to protect the phosphor 105 from the collision of negative ions; to work as an electrode for applying an electron beam-accelerating voltage; and to work as a conducting path for electrons after having excited the phosphor 105.

A spacer 107a shows the electrostatically charged state of the spacer, and shows a state in which electrostatic charge (positive electrostatic charge in the drawing) is caused by collision of a portion of the electrons emitted from an electron source around it. Here, the spacer 107a shows the electrostatically charged state of the spacer when having no antistatic film 112 installed thereon, and thus, the thickness of a low-resistivity film is drawn more thickly than the low-resistivity film 110 contacting the antistatic film 112 of the spacer 107b, for convenience in illustration.

When a spacer 107a is positively charged with electricity as described above, electrons emitted from an electron-emitting device 104 being used an electron source are drawn toward the spacer, for example, like an electron trajectory 111a, and consequently impair the quality of a displayed image.

In order to solve this problem, there is a proposition of arranging an antistatic film 112 on a spacer 107b, eliminating the charge by passing a micro-electrical current through the surface, and thereby making electrons follow a predetermined trajectory such as an electron trajectory 111b, without being drawn to the spacer. There is also a proposition, as shown in Japanese Patent Application Laid-Open No. 2001-143620, of providing unevenness on the surface of a spacer glass substrate to reduce the effective secondary emission coefficient below that observed with a flat spacer surface, and effectively to inhibit the electrostatic charge of the spacer surface.

Furthermore, Japanese Patent Application Laid-Open No. H10-284283 proposes a spacer coated with an electrostatic charge-mitigating film containing aluminum nitride or aluminum oxide, and noble metals such as gold, palladium and platinum, by binary simultaneous sputtering with the use of an aluminum target and a noble metal target, and of a mixed gas of argon and nitrogen or oxygen as a gas for forming a film.

However, it has become clear that the spacers shown in the above described conventional examples cause variation in the performance of the function for eliminating electrostatic charge.

In particular, when a temperature distribution is formed in the spacer, the distribution of resistivity is also formed due to the temperature characteristic of the resistivity of the antistatic film. The variation of resistivity leads to variation in the diselectrification function.

Specifically, in a flat display panel, the instability of a display image results from temperature distribution in a panel plane, which is caused by a temperature difference between a face plate and a rear plate.

In addition, a conventional method of forming an antistatic film containing a plurality of elements by sputtering simultaneously a plurality of different material targets (for example, binary sputtering with the use of two materials) might cause variation in the resistivity of an antistatic film depending on each film-forming batch even when film-forming conditions (background, sputtering pressure, gas flow rate and target electrification power) are uniformized.

In order to uniformize resistivity, the target electrification power supplied to different material targets must be adjusted for each, which is complicated, and the operation is not always highly reproducible. In particular, in binary sputtering, when there is a large difference in target electrification power from one target to another, so-called cross contamination can not be avoided, which is a phenomenon in which a more powerfully electrified target material deposits on the surface of a less powerfully electrified target material.

SUMMARY OF THE INVENTION

An object of the present invention is to provide an antistatic film having superior controllability for a resistivity value, stability and reproducibility, and the adequate temperature characteristics of resistance.

The present invention provides an antistatic film having, in one embodiment, a structure comprising a plurality of conductor particles with particle diameters of 0.5 to 10 nm dispersed in a medium containing a nitride.

In addition, the present invention provides an antistatic film having a structure comprising a plurality of conductor particles with particle diameters of 0.5 to 10 nm dispersed in a medium containing an oxide.

In addition, the present invention provides an antistatic film having a structure comprising a plurality of conductor particles with particle diameters of 0.5 to 10 nm dispersed in a medium containing a nitride and an oxide.

In addition, the present invention provides an antistatic film having a structure comprising a plurality of semiconductor particles with particle diameters of 0.5 to 10 nm dispersed in a medium containing a nitride.

In addition, the present invention provides an antistatic film having a structure comprising a plurality of semiconductor particles with particle diameters of 0.5 to 10 nm dispersed in a medium containing an oxide.

In addition, the present invention provides an antistatic film having a structure of dispersing a plurality of semiconductive particles with particle diameters of 0.5 to 10 nm in a medium containing a nitride and an oxide.

The term "medium" here is used to refer to the part of the film other than the particles.

In addition, the present invention provides an electron-generating device with an electron source in an airtight vessel, comprising any of the above described antistatic films in the airtight vessel.

In addition, the present invention provides a picture display unit provided with an airtight vessel having a first substrate with an electron source arranged thereon, and a second substrate with an image display member arranged thereon so as to face the electron source, and a spacer arranged between the first and second substrates in the above described airtight vessel, wherein the spacer has any of the above described antistatic films arranged on the surface.

In addition, the present invention provides a spacer arranged between a first substrate and a second substrate in a picture display unit provided with an airtight vessel having the first substrate with an electron source arranged thereon and the second substrate having an image display member arranged thereon so as to face the electron source, wherein the spacer has any of the above described antistatic films on the surface.

DESCRIPTION OF THE PREFERRED EMBODIMENTS

Figure 1:
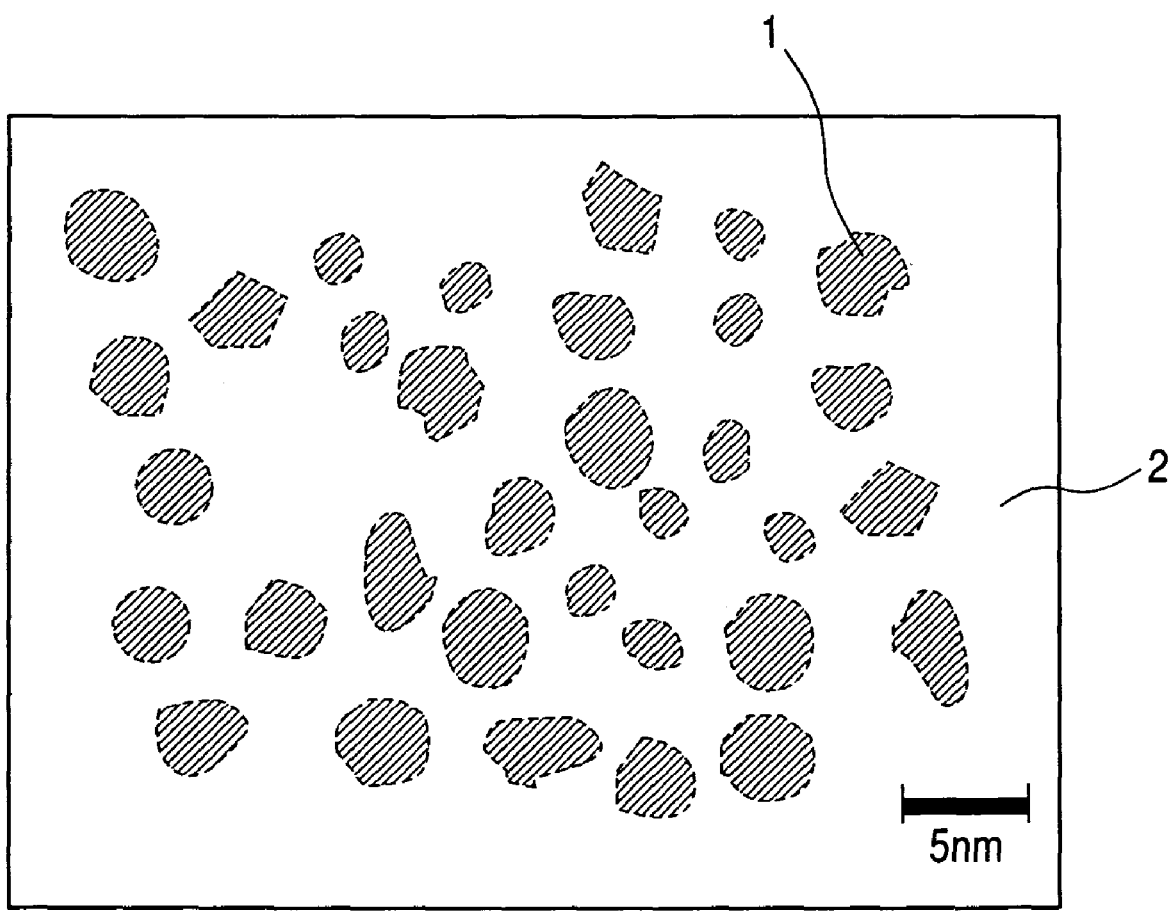
FIG. 1 is a schematic view showing the cross-sectional shape of an antistatic film according to the present invention, observed with a TEM (a transmission electron microscope)

The present invention provides an antistatic film having a structure comprising a plurality of conductor particles with particle diameters of 0.5 to 10 nm dispersed in a medium containing a nitride.

In addition, the present invention provides an antistatic film having a structure comprising a plurality of conductor particles with particle diameters of 0.5 to 10 nm dispersed in a medium containing an oxide.

In addition, the present invention provides an antistatic film having a structure comprising a plurality of conductor particles with particle diameters of 0.5 to 10 nm dispersed in a medium containing a nitride and an oxide.

In addition, the conductor particle is preferably a noble metal particle.

In addition, the conductor particle is preferably a platinum particle, and the nitride is preferably aluminum nitride.

In addition, the conductor particle is preferably a platinum particle, and the oxide is preferably aluminum oxide.

In addition, the conductor particle is preferably a platinum particle, a nitride is preferably aluminum nitride, and the oxide is preferably aluminum oxide.

In addition, the conductor particle is preferably a gold particle, and the nitride is preferably aluminum nitride.

In addition, the conductive particle is preferably a gold particle, and the oxide is preferably aluminum oxide.

In addition, the conductor particle is preferably a gold particle, the nitride is preferably aluminum nitride, and the oxide is preferably aluminum oxide.

In addition, the conductor particle is preferably a silver particle, and the nitride is preferably aluminum nitride.

In addition, the conductor particle is preferably a silver particle, and the oxide is preferably aluminum oxide.

In addition, the conductor particle is preferably a silver particle, the nitride is preferably aluminum nitride, and the oxide is preferably aluminum oxide.

In addition, the content of the conductor is preferably 0.1 to 10 atomic %.

In addition, the present invention provides an antistatic film having a structure comprising a plurality of semiconductor particles with particle diameters of 0.5 to 10 nm dispersed in a medium containing a nitride.

In addition, the present invention provides an antistatic film having a structure comprising a plurality of semiconductor particles with particle diameters of 0.5 to 10 nm dispersed in a medium containing an oxide.

In addition, the present invention provides an antistatic film having a structure of dispersing a plurality of semiconductive particles with particle diameters of 0.5 to 10 nm in a medium containing a nitride and an oxide.

In addition, the semiconductor particle is preferably a germanium particle, and the nitride is preferably silicon nitride.

In addition, the semiconductor particle is preferably a germanium particle, and the oxide is preferably silicon oxide.

In addition, the conductor particle is preferably a germanium particle, the nitride is preferably silicon nitride, and the oxide is preferably silicon oxide.

In addition, the content of the semiconductor is preferably 0.1 to 10 atomic %.

In addition, any of the above described antistatic films includes the particle with a diameter of 1.0 to 9.0 nm, and has a resistivity of $\rho=1\times10^4$ to $1\times10^{11}$ Ωcm.

In addition, the present invention provides an electron-generating device with an electron source in an airtight vessel, comprising any of the above described antistatic films in the airtight vessel.

In addition, the present invention provides a picture display unit provided with an airtight vessel having a first substrate with an electron source arranged thereon, and a second substrate with an image display member arranged thereon so as to face the electron source, and a spacer arranged between the first and second substrates in the above described airtight vessel, wherein the spacer has any of the above described antistatic films arranged on the surface.

In addition, the present invention provides a spacer arranged between a first substrate and a second substrate in a picture display unit provided with an airtight vessel having the first substrate with an electron source arranged thereon and the second substrate having an image display member arranged thereon so as to face the electron source, wherein the spacer has any of the above described antistatic films on the surface.

The above described antistatic film according to the present invention has little change of resistivity due to temperature, and when the antistatic film is provided particularly on the surface of the spacer of the picture display unit, it has the effect of reducing the instability of a display image, which originates from a temperature distribution in an airtight vessel caused by a temperature difference between the above described first and second substrates.

Furthermore, the present invention provides a mixture target of aluminum and platinum including 95 wt. % or more aluminum and platinum, which is used for forming an antistatic film containing aluminum and platinum by a sputtering technique.

In addition, the present invention provides a mixture target of aluminum nitride and platinum including 95 wt. % or more aluminum and platinum, which is used for forming an antistatic film containing aluminum and platinum by a sputtering technique.

Furthermore, the present invention provides a method for manufacturing an antistatic film containing aluminum and platinum, comprising sputtering the mixture target in an atmosphere containing only nitrogen.

In addition, the present invention provides a method for manufacturing an antistatic film containing aluminum and platinum, comprising sputtering the mixture target in an atmosphere containing only oxygen.

In addition, the present invention provides a method for manufacturing an antistatic film containing aluminum and platinum, comprising sputtering the mixture target in an atmosphere containing nitrogen and oxygen.

A target according to the present invention, as described above, can be preferably used as a target particularly of a PVD (Physical Vapor Deposition) apparatus such as an electron beam evaporation apparatus and a sputtering apparatus. When the PVD (Physical Vapor Deposition) apparatus employs a target according to the present invention as the target thereof, it can produce a resistive film having high reproducibility, superior controllability of a resistivity value, and temperature characteristics of the resistance.

In addition, a method for manufacturing an antistatic film according to the present invention has the effect of reducing the variation in the resistivity and increasing the reproducibility of the film characteristic (resistivity) than with binary simultaneous sputtering.

EMBODIMENTS

First of all, an antistatic film according to the present invention is a resistive film as shown in FIG. 1 that is a schematic view showing the cross-sectional shape observed with a TEM (a transmission electron microscope), having a structure comprising a plurality of particles 1 with an average particle diameter of 0.5 to 10 nm dispersed in a medium 2. Here, the average particle diameter is obtained by measuring the diameters of 20 particles in a cross-sectional shape as shown in FIG. 1 and calculating the average.

If the particles have an average particle diameter of 0.5 nm or larger, preferably 1 nm or larger, a resistive film including them can be judged to have adequate temperature characteristics of resistance. Specifically, the resistive film can be judged to have little variation of resistance due to a temperature change. Accordingly, when the spacer having the resistive film as an antistatic film is used in a picture display unit, the spacer can reduce the disarray of a display image caused by it. In addition, the above-described average particle diameter is 10 nm or smaller, and preferably 9 nm or smaller from the viewpoint comprising a resistivity of the resistive film equal to or higher than $1 \times 10^6$ $\Omega$cm.

As described above, the above described resistive film contains an electron source, is arranged in an airtight vessel having temperature change, and is preferably applied to the resistive film for preventing electrostatic charge in the airtight vessel, namely, to an antistatic film.

Embodiments according to the present invention will be now described below.

At first, a first embodiment shows a resistive film having a structure comprising a plurality of conductor particles with particle diameters of 0.5 to 10 nm dispersed in a medium containing a nitride.

A second embodiment shows a resistive film having a structure comprising a plurality of conductor particles with particle diameters of 0.5 to 10 nm dispersed in a medium containing an oxide.

A third embodiment shows a resistive film having a structure comprising a plurality of conductor particles with particle diameters of 0.5 to 10 nm dispersed in a medium containing a nitride and an oxide.

In each embodiment described above, the conductor is preferably a metal such as platinum, gold, silver, and among the metals, particularly preferably is platinum or gold from the viewpoint of stability and controllability for a resistivity value. In addition, the above described nitride is preferably aluminum nitride, germanium nitride, silicon nitride and magnesium nitride, and among them, particularly preferably is aluminum nitride from the viewpoint of stability and controllability for a resistivity value. In addition, the above described oxide is preferably aluminum oxide, germanium oxide, silicon oxide and magnesium oxide, and among them, particularly preferably is aluminum oxide from the viewpoint of stability and controllability for a resistivity value. In addition, the above described medium containing a nitride and an oxide, particularly preferably is aluminum nitride/oxide from the viewpoint of stability and controllability for a resistivity value, and the adequate temperature characteristics of resistance.

Subsequently, a fourth embodiment shows a resistive film having a structure comprising a plurality of semiconductor particles with particle diameters of 0.5 to 10 nm dispersed in a medium containing a nitride.

A fifth embodiment shows a resistive film having a structure comprising a plurality of semiconductor particles with particle diameters of 0.5 to 10 nm dispersed in a medium containing an oxide.

The sixth embodiment shows a resistive film having a structure comprising a plurality of semiconductive particles with particle diameters of 0.5 to 10 nm dispersed in a medium containing a nitride and an oxide.

In the fourth, fifth and sixth embodiments described above, the above semiconductor is preferably germanium, silicon and the like, and among the semiconductors, is particularly preferably germanium from the viewpoint of stability and controllability for a resistivity value. In addition, the above described nitride is preferably aluminum nitride, germanium nitride, silicon nitride and magnesium nitride, and among them, particularly preferably is silicon nitride from the viewpoint of stability and controllability for a resistivity value. In addition, the above described oxide is preferably aluminum oxide, germanium oxide, silicon oxide and magnesium oxide, and among them, particularly preferably is silicon oxide from the viewpoint of stability and controllability for a resistivity value. In addition, the above described medium containing a nitride and an oxide, particularly preferably is silicon nitride/ oxide from the viewpoint of stability and controllability for a resistivity value, and the adequate temperature characteristics of resistance.

In addition, when the resistive film of each of above described first to sixth embodiments is applied to an antistatic film on the surface of a spacer arranged between first and second substrates particularly of a picture display unit provided with an airtight vessel having the first substrate with an electron source arranged thereon and the second substrate with an image display member arranged so as to face the above described electron source, among electron-generating devices, the above each resistive film has the resistivity preferably of $\rho=1\times10^4$ to $1\times10^{11}$ $\Omega$cm, and has a conductor or semiconductor content preferably of 0.1 to 10 atomic %.

Subsequently, a method for obtaining the above described resistive film will be described.

The above described resistive film is preferably formed (1) with a sputtering technique by using a mixture target containing at least a component composing a conductor particle or a semiconductor particle and a component to be nitrided or oxidized for composing a nitride or an oxide, and (2) in a sputtering atmosphere containing nitrogen gas with a nitrogen partial pressure of 70% or higher, or oxygen gas with an oxygen partial pressure of 70% or higher. As a matter of course, the atmosphere may be a mixed gas atmosphere if the partial pressure is in the above described range. In addition, the mixed gas atmosphere is particularly preferably the atmosphere of the gas of nitrogen mixed with oxygen, and in this case, the partial pressure of nitrogen and oxygen is preferably controlled to 70% or more in total.

The particle diameter can be appropriately varied in the range of 0.5 to 10 nm by changing the component and the ratio in the composition of a mixing target, and a gas sort, a sputtering pressure and an electrification power during film formation by sputtering, in the above described conditions (1) and (2), so that a resistive film can be obtained so as to acquire the resistance controlled to a preferable range for an electron generating device to which the resistive film is applied.

Subsequently, a sputtering apparatus used for forming the resistive film according to the above described embodiments will be described.

(Sputtering Apparatus)

Figure 3:
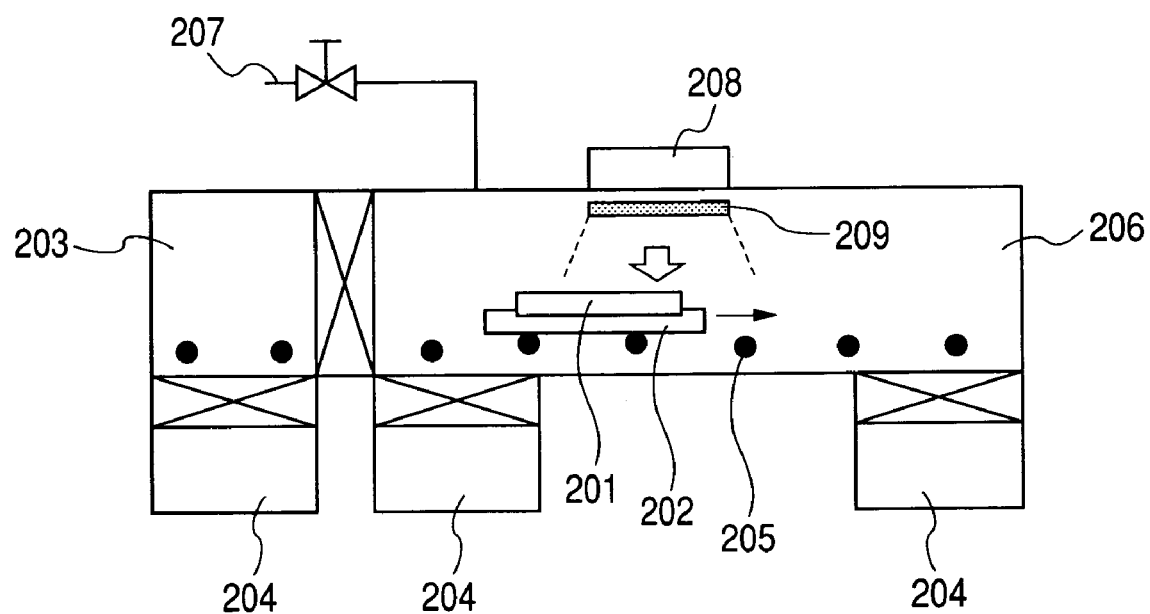
FIG. 3 is a block diagram of a high-frequency sputtering apparatus arranging a target according to the present invention therein, which is used for imparting an antistatic film to a spacer substrate.

FIG. 3 shows the configuration of a high-frequency sputtering apparatus used in the present embodiment.

The summary of the process of forming the above described resistive film by using it will be now described. At first, a substrate 201 is put on a film-forming tray 202, and is charged into a preliminary exhaust hood 203. The preliminary exhaust hood is exhausted to a vacuum degree of $5\times10^{-4}$ [Pa] or lower with a vacuum pump 204, and then the film-forming tray 202 is moved to a film-forming chamber 206 by a conveyance roller 205. Then, the film-forming chamber 206 is evacuated to a vacuum of $2\times10^{-5}$ [Pa] or less. After the vacuum has been confirmed to have reached the above described value, the specified quantity of a nitrogen gas, an oxygen gas, the mixed gas of argon and nitrogen, the mixed gas of argon and oxygen, or the mixed gas of nitrogen and oxygen is passed into the film-forming chamber through a gas introduction pipe 207. An orifice (not shown) is adjusted so that the total pressure of a sputtering gas becomes a predetermined pressure. After an atmosphere (the total pressure of a sputtering gas, a gas flow rate) has become stable, a predetermined power is applied to a high-frequency power source 208. In order to form a resistive film all over the surface of a substrate 201, a film-forming tray 202 is transported by a transporting roller 205 at the rate of 5 mm/min in the direction of an arrow in the drawing so as to cross directly under a mixture target 209, after sputtering discharge has started. The distance between the substrate and the mixture target is set to 200 mm.

Here, the high voltage of direct current applied to the mixture target 209 is adjusted by a high-frequency power source 208 so that the variation originating from the transportation of the substrate can be reduced.

The direction of transporting the substrate is not limited to one direction, but one-return transportation or a plurality of return transportation is acceptable. In addition, in some configurations of the apparatus, a film may be formed on the whole surface by rotating the substrate directly under the target.

Through the above described steps, a resistive film can be formed on a substrate.

In addition, when a resistive film is to be formed on both sides of a substrate, the film is formed on a surface (a first surface), then a film-forming tray 202 is returned to a preliminary exhaust hood 203, and the substrate 201 is taken out. Subsequently, the substrate 201 is reversed, and the above described resistive film is formed on a back surface (a second surface) similarly to the top surface (the first surface).

The resistive film to be formed on each surface of the top surface (a first surface) and the back surface (a second surface) may be a single-layered film with a desired film thickness, or a multilayer film consisting of a plurality of layers, which is produced by using a plurality of targets each having a different composition concentration ratio of the mixture from others.

Subsequently, a mixture target used in the above described sputtering apparatus will be described.

(Method for Producing Mixture Target)

Here, a method for producing the above described mixture-sintered target will be described.

1) Mixing

At first, the weight of each powder of the above described components is measured in accordance with various composition concentration ratios, and the powders are mixed. For instance, the powders of Pt and Al, or Pt and AlN are mixed. A mixing device is not limited in particular, but a ball mill may be used. The powders are mixed in a non-oxidative atmosphere of nitrogen gas, Ar gas or the like. After the powders have been mixed, they may be classified by a sieve or the like as needed.

2) Calcination

The mixed powder is calcined in an inert atmosphere of nitrogen gas, Ar gas or the like, or in a vacuum. Alternatively, it may be calcined in a reducing atmosphere of hydrogen or the like. The mixed powder is preferably heated to 800 to 1,500° C., for calcination.

3) Pulverization

Thus formed solid material is pulverized. A pulverizing device is not limited in particular, but a ball mill may be used. The solid material is pulverized in a non-oxidative atmosphere of nitrogen gas, Ar gas or the like. After the solid material has been pulverized, the product may be classified with a sieve or the like as needed.

4) Baking

The mixed powder obtained through pulverization is pressure-baked in an inert atmosphere of nitrogen gas, Ar gas or the like, or in a vacuum, and a sintered compact is thereby obtained. The mixed powder may be pressure-baked in a reducing gas atmosphere of hydrogen or the like. Hot pressing is preferably used for pressure baking. The sintered compact is formed so as to have a predetermined plate thickness and shape for being sputtered, then is preferably heated to 800 to 1,500° C. under the pressure of 1 to 2 MPa, which is a baking step, and becomes a mixture-sintered target.

(Method for Producing Mixture-Melted Alloy Target)

Here, a method for producing a mixture-melted alloy target will be described.

1) Melting

At first, the weight of each raw material of the above described components is measured in accordance with various composition concentration ratios, and the raw materials are mixed. For instance, the raw materials of Pt and Al, or Pt and AlN are mixed, and melted in a melting furnace. A melting method for the raw materials is not limited in particular, but in order to prevent contamination with atmospheric impurities, the raw materials are desirably melted in a vacuum.

2) Cooling

The above described melted mixture is cooled while the condition is adjusted not so as to cause the segregation of the components.

3) Forge-Rolling

The thus-produced solid material is forge-rolled while being heated. A void (a cavity) produced during cooling is filled, and melting irregularities and density irregularities are uniformized.

4) Baking

The solid material obtained through the above described steps is pressure-baked in an inert atmosphere of Ar gas or the like, or in a vacuum, and a Pt—Al or Pt—AlN mixture-melting alloy is thereby obtained. The solid material may be pressure-baked in a reducing gas atmosphere of hydrogen or the like. Hot pressing is preferably used for pressure baking. The mixture-melting alloy is formed so as to have a predetermined plate thickness and shape for being sputtered, and becomes a mixture-melted alloy target.

In the same way as described above, an aluminum-platinum mixture target containing 95 wt. % or more aluminum and platinum, or an aluminum nitride-platinum mixture target containing 95 wt. % or more aluminum and platinum can be formed.

In the next place, the whole configuration of a picture display unit will be described, in which a substrate having the above described resistive film formed thereon as a spacer, and the spacer is inserted into the picture display unit.

(Panel Configuration)

Figure 2:
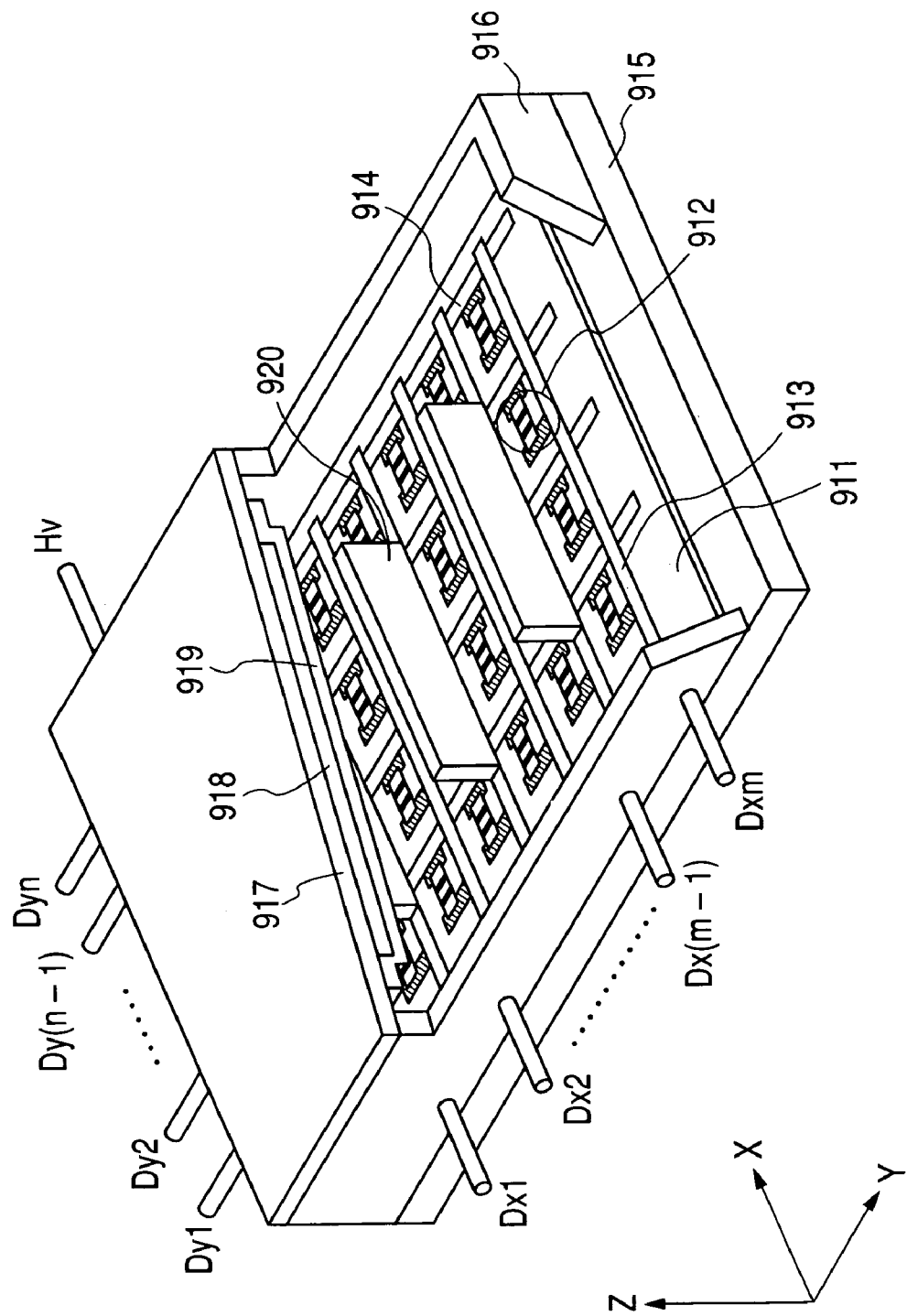
FIG. 2 is a perspective view showing a picture display unit according to the present invention, of which one part of the display panel is cut.

FIG. 2 is a perspective view of a display panel in a picture display unit according to the present embodiment, in which one part of the panel is cut in order to show an inner structure.

In the figure, reference numeral 915 denotes a rear plate, reference numeral 916 a side wall, and reference numeral 917 a face plate. The rear plate 915, the side wall 916 and the face plate 917 forms an airtight vessel for keeping the inside of the display panel into a vacuum. When the airtight vessel is assembled, joining areas between members need to be sealed in order to make the joining areas retain adequate strength and airtightness. The sealing is achieved, for example, by applying frit glass to the joining areas and baking it at 400 to 500° C. for 10 minutes or longer in atmospheric air or a nitrogenous atmosphere. A method for evacuating the inside of an airtight vessel to a vacuum will be described later.

In addition, the inside of the above described airtight vessel is kept in a vacuum of about $10^{-4}$ [Pa], so that for the purpose of preventing the destruction of the airtight vessel due to an ambient pressure or unexpected shock, a spacer 920 is provided so as to make the airtight vessel an ambient-pressure resistant structure. As the spacer, a substrate having an antistatic film is used, which is produced by using the above described mixture targets having various composition concentration ratios in forming films.

A substrate 911 is fixed on a rear plate 915, while having N×M pieces of surface conduction electron-emitting devices 912 formed thereon. Here, N and M are positive integers not less than 2 and are appropriately set in accordance with an objective display pixel number. For instance, in a display device for displaying a high definition picture, those numbers are preferably N=3,000 and M=1,000 or more. In the present embodiment, the numbers are set to N=3,072 and M=1,024.

The above described N×M pieces of surface conduction electron-emitting devices are simple-matrix-wired by M lines of row-directional wiring 913 and N lines of column-directional wiring 914. The part composed by the substrate 911, the surface conduction electron-emitting devices 912, the row-directional wiring 913 and the column-directional wiring 914 is called an electron source substrate.

In addition, a fluorescent screen 918 is formed on the undersurface of a faceplate 917. In addition, a metal back 919, which is well known in the field of CRT, is arranged on the surface of the rear plate side of the fluorescent screen 918.

Dx1 to Dxm, Dy1 to Dyn and Hv are terminals for electric connection having an airtight structure, which is arranged for electrically connecting the display panel to a not-shown electric circuit.

Terminals Dx1 to Dxm are electrically connected to the row-directional wiring 913 of the surface conduction electron-emitting devices, terminals Dy1 to Dyn to the column-directional wiring 914 of the surface conduction electron-emitting devices, and Hv to a metal back (a metallic membrane) of a face plate 919.

In order to evacuate the inside of an airtight vessel to a vacuum, the airtight vessel is assembled, a not-shown exhaust pipe is connected with a vacuum pump, and the inside of the airtight vessel is evacuated to a vacuum of $10^{-5}$ [Pa] or lower. Afterwards, the exhaust pipe is sealed. Then, in order to keep the vacuum in the airtight vessel, a getter film (not shown) is formed just before or after sealing, on a predetermined position in the airtight vessel. The getter film is formed by heating and evaporating a getter material containing, for instance, Ba as a main component with a heater or high-frequency heating, and by the adsorption effect of the getter film, the inside of the airtight vessel is kept to a vacuum of $1 \times 10^{-3}$ to $1 \times 10^{-5}$ [Pa].

In the above described picture display unit using a display panel, when electric voltage is applied to each surface conduction electron-emitting device 912 through terminals outside a vessel, Dx1 to Dxm and Dy1 to Dyn, electrons are emitted from each surface conduction electron-emitting device 912. Concurrently with it, a high pressure of several hundreds [V] to several thousands [V] is applied to a metal back (metal membrane) 919 through the terminals outside the vessel Hv to accelerate the above described emitted electrons and make them collide with the inner surface of a face plate 917. Thereby, each phosphor of each color composing a phosphor layer 918 is activated to emit light, and images are displayed.

Normally, voltage applied to the surface conduction electron-emitting device 912 according to the present invention is around 12 to 16 [V], a distance d between a metal back (a metal membrane) 919 and the surface conduction electron-emitting device 912 is around 0.1 to 8 [mm], and voltage between the metal back (the metal membrane) 919 and the surface conduction electron-emitting device 912 is about 0.1 [kV] to 12 [kV].

A picture display unit and a spacer having a resistance film (an antistatic film) formed on the surface, which is used as a support structure therein, have been described above. However, according to the concept of the present invention, the spacer can be used not only for the picture display unit, but also as a light-emitting source substituted for a light-emitting diode of an optical printer constituted by a photosensitive drum and a light-emitting diode. In addition, if, at this time, the above described m lines of row-directional wiring and the n lines of column-directional wiring are appropriately selected, the spacer can be applied not only to a line-shaped light-emitting source but also to a two-dimensional light-emitting source. In the above case, the body to be irradiated with electrons can be not only a material directly emitting light such as a phosphor, but also a member on which a latent image is formed by the electrostatic charge of electrons. In addition, according to the concept of the present invention, the present invention can be applied to an electron-generating device, even when a material other than an image-forming member such as a phosphor is used as a body to be irradiated with the electrons emitted from an electron source, like in an electron microscope.

(Evaluation Method for Image)

A spacer substrate was prepared by forming a resistive film according to the present invention as an antistatic film on a glass substrate, and was used as a spacer in a picture display unit using the surface conduction electron-emitting device, which is the present embodiment.

Figure 8:
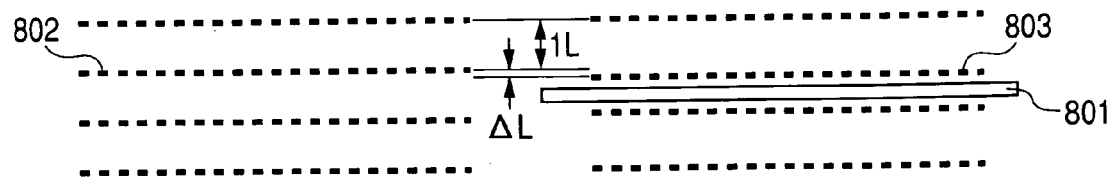
FIG. 8 is a view explaining the deviation of an electron beam ΔL which appears as the disarray of a display image due to the influence of a spacer according to the present invention.

When the dielectrification capability of the spacer 801 is insufficient, as shown in FIG. 8, the trajectory of a beam is disturbed and the position of the lighting pixel which should be displayed at regular intervals moves. When a distance L between the original positions 802 of beams is defined as 1 L, the deviation of a difference between the original position and the position 803 of a beam moved by a spacer is shown in ΔL.

The evaluation was carried out by placing a display device in an adequately bright room, and having 50 subjects (adult men and women) visually observe a display image from a position 1 m from the panel face.

The observation result for the disarray of a display image due to the deviation of an electron beam was divided into 3 evaluation stages of "invisible", "visible but not annoying" and "visible and annoying", and a relationship between the stage and the deviation of the beam ΔL was determined. When the majority of the subjects answered "invisible", the deviation ΔL was 0-0.01 L; when they answered "visible but not annoying", the deviation ΔL was 0.01-0.03 L; and when they answered "visible and annoying", the deviation ΔL was 0.03 L or more. The result is shown in Table 1.

The performance of a resistive film according to the present invention was evaluated by installing a spacer provided with the resistive film in a display device, and measuring the deviation of an electron beam ΔL in an image affected by the spacer.

TABLE 1

| Visual evaluation | Deviation of electron beam ΔL | Deviation of electron beam [%] | Evaluation |
|---|---|---|---|
| Invisible | 0-0.01 L | 0-1% | ◎ |
| Visible but not annoying | 0.01-0.03 L | 1-3% | ○ |
| Visible and annoying | 0.03 L or more | 3% or more | X |

EXAMPLES

Specific examples according to the present invention will be described below. Here, atomic % indicates the proportion of the number of atoms of monoatoms, and a Pt/Al weight ratio is calculated by (atomic % of Pt×atomic weight of Pt)/(atomic % of Al×atomic weight of Al).

Example 1

Pt=5 atomic % Pt—Al-melted alloy

The raw materials of Pt and Al were weighed out so as to have the composition ratio of 5 atomic % Pt to 95 atomic % Al, and then were mixed. The mixed materials were melted in a vacuum melting furnace to produce an alloy. The alloy was cooled, and then was forge-rolled to further uniformize the component distribution. The melted alloy was pressure-baked in a vacuum, and was molded so as to acquire a predetermined plate thickness and shape suitable for a sputtering target, and the product became a Pt—Al-melted alloy mixture target. The density of the Pt—Al-melted alloy was 3.6 g/cm$^3$.

A Pt—Al-melted alloy was installed as the target of a high-frequency sputtering apparatus shown in FIG. 3, the flow rate of $N_2$ was set to 100 sccm, and a Pt—Al mixture-nitrided film was formed with varied total pressures. The obtained Pt—Al mixture-nitrided film had the resistivity shown in FIG. 4.

Thus produced Pt—Al mixture-nitrided film was analyzed with the use of an RBS (Rutherford backscattering Spectrometory) method, and had the composition shown in Table 2. In addition, the density of the Pt—Al mixture-nitrided film was 3.5 g/cm$^3$.

TABLE 2

| Film type | Pt content (atomic %) | Concentration measured with RBS analysis (atomic %) | | | | Film density (g/cm$^3$) |
|---|---|---|---|---|---|---|
| | | N | O | Al | Pt | |
| Pt—Al—N | Pt = 3 | 49.8 | 0.3 | 49.1 | 0.8 | 3.0 |
| | Pt = 5 | 50.0 | 0.4 | 47.1 | 2.5 | 3.5 |

Example 2

Pt=3 atomic % Pt—Al-melted alloy

Similarly to the Example 1, raw materials were weighed out so as to have the composition ratio of 3 atomic % Pt to 97 atomic % Al, then, were mixed, melted, cooled, forge-rolled and pressure-baked. Thus, a Pt—Al-melted alloy mixture target was obtained. The density of the Pt—Al-melted alloy was 3.2 g/cm$^3$.

Figure 4:
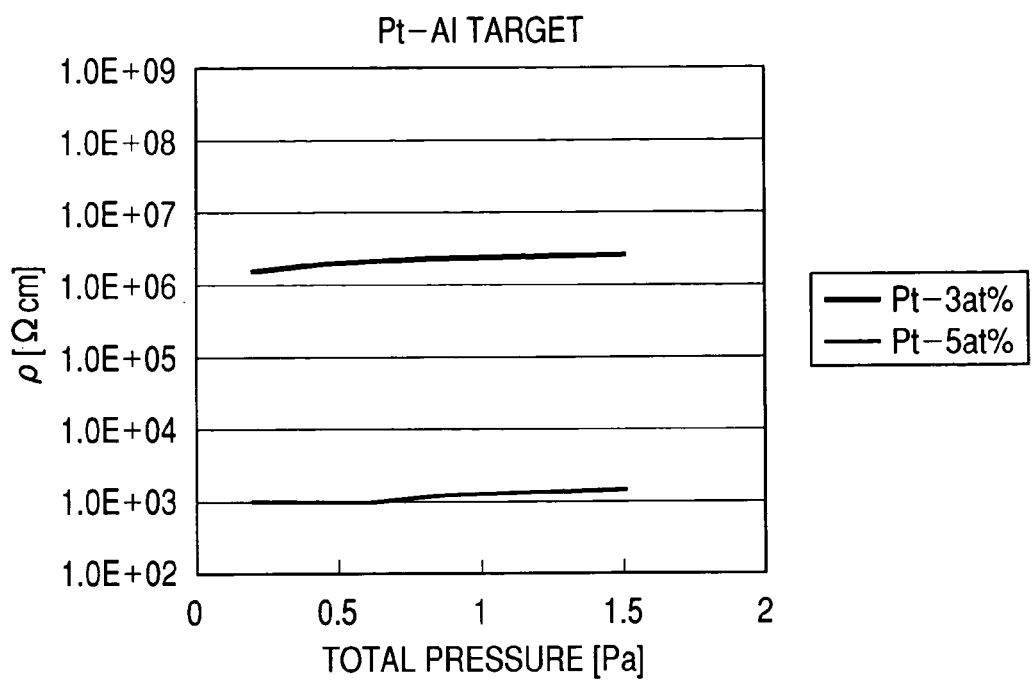
FIG. 4 is a figure showing a relation between the resistivity of a Pt—Al mixture-nitride film according to the present invention and the total pressure of a sputtering gas.

Similarly to the Example 1, a Pt—Al mixture-nitrided film was formed, and had resistivity shown in FIG. 4.

Thus produced Pt—Al mixture-nitrided film was analyzed with the use of an RBS (Rutherford backscattering Spectrometory) method, and had a composition shown in Table 1. In addition, the density of the Pt—Al mixture-nitrided film was 3.0 g/cm$^3$.

Example 3

Pt=5 atomic % Pt—AlN sintered compact

Instead of metallic aluminum, aluminum nitride was used as a raw material.

The powders of Pt and AlN were weighed out so as to have the composition ratio of 5 atomic % Pt to 95 atomic % AlN, and then were mixed. The powders were mixed with a ball mill in a non-oxidization atmosphere of nitrogen gas. After having been mixed, the powders were classified with a sieve to acquire a further uniformized granular form. Thus mixed powder was calcined in a vacuum.

Thus formed solid material was pulverized with the use of a ball mill in the non-oxidation atmosphere of nitrogen gas. After having been pulverized, the powders were classified with a sieve to acquire a still more uniform granular form.

The mixed powder obtained through pulverization was pressure-baked in a vacuum to provide a sintered compact. For the pressure-baking, a hot pressing process of heating the mixed powder to 1,500° C. at the pressure of 2 MPa was employed. The sintered compact was formed so as to acquire a predetermined plate thickness and shape suitable for a sputtering target, and thus a Pt—AlN mixture sintered target was obtained. The Pt—AlN sintered compact had the density of 2.4 g/cm$^3$.

Figure 5:
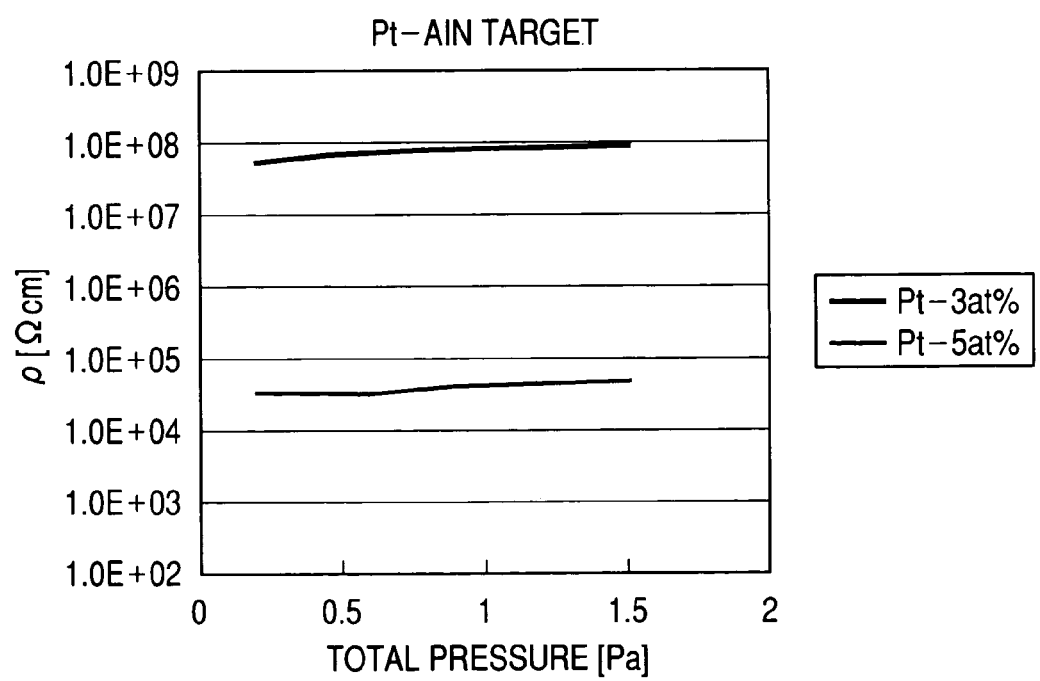
FIG. 5 is a figure showing a relation between the resistivity of a Pt—AlN mixture-nitride film according to the present invention and the total pressure of a sputtering gas.

Similarly to the Example 1, the N$_2$ flow rate was set to 100 sccm, and a Pt—AlN mixture-nitrided film was formed with varied total pressures. Then, the obtained film had resistivity shown in FIG. 5.

Thus produced Pt—AlN mixture-nitrided film was analyzed with the use of an RBS (Rutherford backscattering Spectrometory) method, and was proved to have the composition shown in Table 3. In addition, the Pt—AlN mixture-nitrided film had the density of 3.2 g/cm$^3$.

TABLE 3

| Film type | Pt content (atomic %) | Concentration measured with RBS analysis (atomic %) | | | | Film density (g/cm$^3$) |
|---|---|---|---|---|---|---|
| | | N | O | Al | Pt | |
| Pt—Al—N | Pt = 3 | 45.6 | 8.5 | 45.0 | 0.9 | 2.8 |
| | Pt = 5 | 45.7 | 9.0 | 43.0 | 2.3 | 3.2 |

Example 4

Pt=3 atomic % Pt—AlN sintered compact

Similarly to the Example 3, instead of metallic aluminum, aluminum nitride was used as a raw material, and the raw materials were weighed out so as to have the composition ratio of 3 atomic % Pt to 97 atomic % AlN, then, were mixed, calcinated, pulverized, and pressure-baked. Thus, a Pt—AlN mixture sintered target was obtained. The Pt—AlN sintered compact had the density of 2.0 g/cm$^3$.

Similarly to the Example 1, a N$_2$ flow rate was set to 100 sccm, and a Pt—AlN mixture-nitrided film was formed with varied total pressures. Then, the obtained film had resistivity shown in FIG. 5.

Thus produced Pt—AlN mixture-nitrided film was analyzed with the use of an RBS (Rutherford backscattering) method, and was proved to have the composition shown in Table 3. In addition, the Pt—AlN mixture-nitrided film had the density of 2.8 g/cm$^3$.

Comparative Example 1

Comparison with binary target: Pt=5 atomic % nitrided film

The targets made of elemental Pt and elemental Al were separately prepared. Similarly to the Example 1, a Pt target and an Al target were each installed as the target of a high-frequency sputtering apparatus. Under the conditions of the total pressure of 0.2 Pa and the N$_2$ flow rate of 100 sccm, the power for electrifying each target was adjusted. The film was formed so as to acquire the same Pt content (Pt=2.5 atomic %) as the formed film with the use of the Pt=5 atomic % Pt—Al target.

Figure 6:
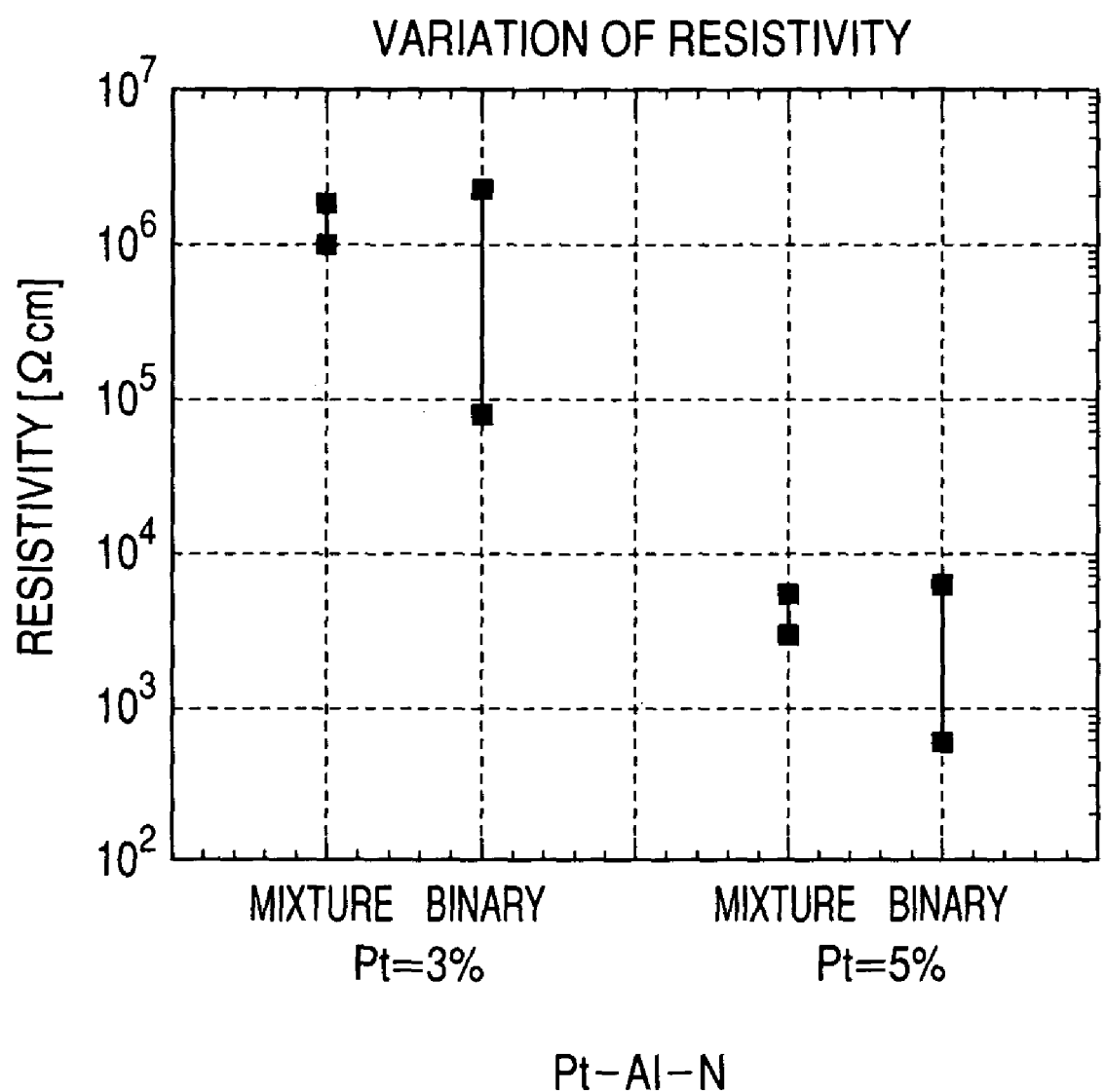
FIG. 6 is a figure showing the variation of the resistivity of a Pt—Al mixture-nitride film according to the present invention.
Figure 7:
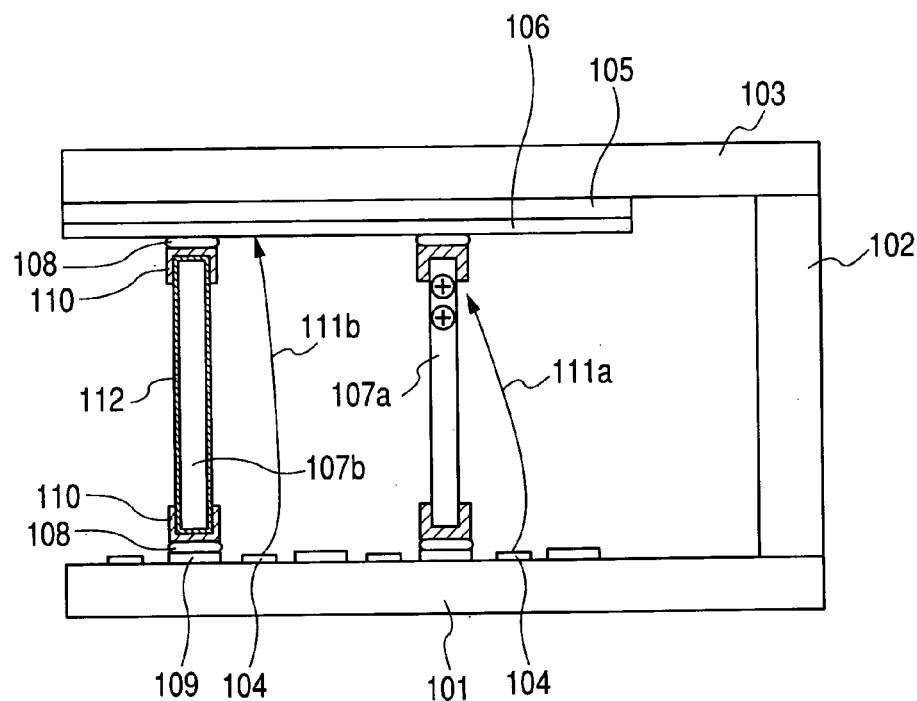
FIG. 7 is a cross-sectional schematic view of an image-forming apparatus using an electron-emitting device, for describing the mechanism of an electrostatic charge in a spacer according to the present invention.

The films were repeatedly formed under thus adjusted equal conditions, but the produced Pt—Al mixture-nitrided film had varied resistivities as are shown in FIG. 6.

Comparative Example 2

Comparison with binary target: Pt=3 atomic % nitrided film The targets made of elemental Pt and elemental Al were separately prepared. Similarly to the Example 1, a Pt target and an Al target were each installed as the target of a high-frequency sputtering apparatus. Under the conditions of the total pressure of 0.2 Pa and the N$_2$ flow rate of 100 sccm, the power for electrifying each target was adjusted. The conditions were adjusted so that the film could acquire the same Pt content (Pt=0.8 atomic %) as the formed film with the use of a Pt=3 atomic % Pt—Al target.

The films were repeatedly formed under thus adjusted equal conditions, but the produced Pt—Al mixture-nitrided film had the variation of resistivities as shown in FIG. 6.

Example 5

As a target used for a high-frequency sputtering apparatus shown in FIG. 2, a Pt—Al mixture target having the composition ratio of 2 atomic % Pt to 98 atomic % Al and the diameter of 8 inches produced in the manner of Example 1 was installed. Under the nitrogen/argon mixed gas flow rate of N$_2$=70 sccm and Ar=30 sccm and the sputtering pressure of 1.0 Pa, the above described Pt—Al mixture target was sputtered with the high-frequency electrification power of 2,400 W.

A glass substrate was introduced into a film-forming chamber, and a film was formed on it. Sputtering time was 30 minutes. Thus obtained resistive film had the film thickness of 200 nm, and the resistivity of 2×10$^9$ Ωcm.

Thus produced Pt—Al mixture-nitrided film was subjected to the measurement of the average particle diameter of platinum particles dispersed in the medium of aluminum nitride through a TEM (transmission electron microscope), and showed the diameter of 0.4 nm.

Example 6

A Pt—Al mixture target was set which had the composition ratio of 2 atomic % Pt to 98 atomic % Al, and the diameter of 8 inches. Under the nitrogen/argon mixed gas flow rate of N$_2$=70 sccm and Ar=30 sccm and the sputtering pressure of 0.5 Pa, the above described Pt—Al mixture target was sputtered with the high-frequency electrification power of 2,400 W.

A glass substrate was introduced into a film-forming chamber, and the film was formed on it. After the sputtering time of 25 minutes, a resistive film having the thickness of 200 nm was obtained. The obtained resistive film had the resistivity of 1×10$^9$ Ωcm.

Thus produced Pt—Al mixture-nitrided film was subjected to the measurement of the average particle diameter of platinum particles dispersed in the medium of aluminum nitride through a TEM (transmission electron microscope), and showed the average particle diameter of 0.5 nm.

Example 7

A Pt—Al mixture target was set which had the composition ratio of 2 atomic % Pt to 98 atomic % Al, and the diameter of 8 inches. Under the nitrogen/argon mixed gas flow rate of N$_2$=70 sccm and Ar=30 sccm and the sputtering pressure of 0.3 Pa, the above described Pt—Al mixture target was sputtered with the high-frequency electrification power of 2,400 W.

A glass substrate was introduced into a film-forming chamber, and the film was formed on it. After the sputtering time of 20 minutes, a resistive film having the thickness of 200 nm was obtained. The obtained resistive film had a resistivity of $8 \times 10^8$ Ωcm.

Thus produced Pt—Al mixture-nitrided film was subjected to the measurement of the average particle diameter of platinum particles dispersed in the medium of aluminum nitride through a TEM (transmission electron microscope), and showed an average particle diameter of 0.6 nm.

Example 8

A Pt—Al mixture target was set which had a composition ratio of 30 atomic % Pt to 70 atomic % Al, and a diameter of 8 inches. Under the nitrogen/argon mixed gas flow rate of $N_2$=70 sccm and Ar=30 sccm and the sputtering pressure of 1.0 Pa, the above described Pt—Al mixture target was sputtered with high-frequency electrification power of 2,400 W.

A glass substrate was introduced into a film-forming chamber, and the film was formed on it. After a sputtering time of 30 minutes, a resistive film having a thickness of 200 nm was obtained. The obtained resistive film had a resistivity of $1 \times 10^4$ Ωcm.

The thus-produced Pt—Al mixture-nitrided film was subjected to the measurement of the average particle diameter of platinum particles dispersed in the medium of aluminum nitride through a TEM (transmission electron microscope), and showed an average particle diameter of 9 nm.

Example 9

A Pt—Al mixture target was set which had a composition ratio of 30 atomic % Pt to 70 atomic % Al, and a diameter of 8 inches. Under the nitrogen/argon mixed gas flow rate of $N_2$=70 sccm and Ar=30 sccm and the sputtering pressure of 0.5 Pa, the above described Pt—Al mixture target was sputtered with high-frequency electrification power of 2,400 W.

A glass substrate was introduced into a film-forming chamber, and the film was formed on it. After a sputtering time of 25 minutes, a resistive film having a thickness of 200 nm was obtained. The obtained resistive film had a resistivity of $1 \times 10^4$ Ωcm.

Thus produced Pt—Al mixture-nitrided film was subjected to the measurement of the average particle diameter of platinum particles dispersed in the medium of aluminum nitride through a TEM (transmission electron microscope), and showed a average particle diameter of 10 nm.

Example 10

A Pt—Al mixture target was set which had a composition ratio of 30 atomic % Pt to 70 atomic % Al, and a diameter of 8 inches. Under the nitrogen/argon mixed gas flow rate of $N_2$=70 sccm and Ar=30 sccm and the sputtering pressure of 0.3 Pa, the above described Pt—Al mixture target was sputtered with high-frequency electrification power of 2,400 W.

A glass substrate was introduced into a film-forming chamber, and the film was formed on it. After a sputtering time of 20 minutes, a resistive film having a thickness of 200 nm was obtained. The obtained resistive film had a resistivity of $1 \times 10^0$ Ωcm.

The thus-produced Pt—Al mixture-nitrided film was subjected to the measurement of the average particle diameter of platinum particles dispersed in the medium of aluminum nitride through a TEM (transmission electron microscope), and showed an average particle diameter of 11 nm.

Example 11

A film was formed with the use of a Pt—Al mixture target having a composition ratio of 2 atomic % Pt to 98 atomic % Al and a diameter of 8 inches, at the nitrogen-gas flow rate of $N_2$=100 sccm. The sputtering pressure was set to 1.0 Pa, and the electrification power to 2,400 W.

After a sputtering time of 70 minutes, a resistive film having a thickness of 200 nm was obtained. The resistive film had a resistivity of $1 \times 10^{11}$ Ωcm.

The thus-produced Pt—Al mixture-nitrided film was subjected to the measurement of the average particle diameter of platinum particles dispersed in the medium of aluminum nitride through a TEM (transmission electron microscope), and showed an average particle diameter of 0.8 nm.

Example 12

A film was formed with the use of a Pt—Al mixture target having a composition ratio of 2 atomic % Pt to 98 atomic % Al and a diameter of 8 inches, at the nitrogen-gas flow rate of $N_2$=100 sccm. The sputtering pressure was set to 0.5 Pa, and the electrification power to 2,400 W.

After a sputtering time of 65 minutes, a resistive film having a film thickness of 200 nm was obtained. The resistive film had a resistivity of $1 \times 10^{11}$ Ωcm.

The thus-produced Pt—Al mixture-nitrided film was subjected to the measurement of the average particle diameter of platinum particles dispersed in the medium of aluminum nitride through a TEM (transmission electron microscope), and showed an average particle diameter of 1 nm.

Example 13

A film was formed with the use of a Pt—Al mixture target having a composition ratio of 2 atomic % Pt to 98 atomic % Al and a diameter of 8 inches, at a nitrogen-gas flow rate of $N_2$=100 sccm. The sputtering pressure was set to 0.3 Pa, and the electrification power to 2,400 W.

After a sputtering time of 60 minutes, a resistive film having a film thickness of 200 nm was obtained. The resistive film had a resistivity of $8 \times 10^{10}$ Ωcm.

The thus-produced Pt—Al mixture-nitrided film was subjected to the measurement of the average particle diameter of platinum particles dispersed in the medium of aluminum nitride through a TEM (transmission electron microscope), and showed a diameter of 2 nm.

Example 14

A film was formed with the use of a Pt—Al mixture target having a composition ratio of 30 atomic % Pt to 70 atomic % Al and a diameter of 8 inches, at a nitrogen-gas flow rate of $N_2$=100 sccm. The sputtering pressure was set to 1.0 Pa, and the electrification power to 2,400 W.

After a sputtering time of 70 minutes, a resistive film having thickness of 200 nm was obtained. The resistive film had a resistivity of $1 \times 10^4$ Ωcm.

The thus-produced Pt—Al mixture-nitrided film was subjected to the measurement of the average particle diameter of platinum particles dispersed in the medium of aluminum nitride through a TEM (transmission electron microscope), and showed an average particle diameter of 9 nm.

Example 15

A film was formed with the use of a Pt—Al mixture target having a composition ratio of 30 atomic % Pt to 70 atomic % Al and a diameter of 8 inches, at a nitrogen-gas flow rate of $N_2=100$ sccm. The sputtering pressure was set to 0.5 Pa, and the electrification power to 2,400 W.

After a sputtering time of 65 minutes, a resistive film having a film thickness of 200 nm was obtained. The resistive film had a resistivity of $1\times10^4$ Ωcm.

The thus-produced Pt—Al mixture-nitrided film was subjected to the measurement of the average particle diameter of platinum particles dispersed in the medium of aluminum nitride through a TEM (transmission electron microscope), and showed an average particle diameter of 10 nm.

Example 16

A film was formed with the use of a Pt—Al mixture target having a composition ratio of 30 atomic % Pt to 70 atomic % Al and a diameter of 8 inches, at a nitrogen-gas flow rate of $N_2=100$ sccm. The sputtering pressure was set to 0.3 Pa, and the electrification power to 2,400 W.

After the sputtering time of 60 minutes, a resistive film having a film thickness of 200 nm was obtained. The resistive film had a resistivity of $1\times10^2$ Ωcm.

The thus-produced Pt—Al mixture-nitrided film was subjected to the measurement of the average particle diameter of platinum particles dispersed in the medium of aluminum nitride through a TEM (transmission electron microscope), and showed an average particle diameter of 11 nm.

Example 17

A Pt—Al mixture target was set which had a composition ratio of 2 atomic % Pt to 98 atomic % Al, and a diameter of 8 inches. Under an oxygen gas flow rate of $O_2=100$ sccm and a sputtering pressure of 1.0 Pa, the above described Pt—Al mixture target was sputtered with high-frequency electrification power of 2,400 W.

A glass substrate was introduced into a film-forming chamber, and the film was formed on it. After a sputtering time of 70 minutes, a resistive film having a thickness of 200 nm was obtained. The obtained resistive film had a resistivity of $5\times10^{11}$ Ωcm.

The thus-produced Pt—Al mixture-oxidized film was subjected to the measurement of the average particle diameter of platinum particles dispersed in the medium of aluminum oxide through a TEM (transmission electron microscope), and showed an average particle diameter of 0.4 nm.

Example 18

A Pt—Al mixture target was set which had a composition ratio of 2 atomic % Pt to 98 atomic % Al, and a diameter of 8 inches. Under an oxygen gas flow rate of $O_2=100$ sccm and a sputtering pressure of 0.5 Pa, the above described Pt—Al mixture target was sputtered with high-frequency electrification power of 2,400 W.

A glass substrate was introduced into a film-forming chamber, and the film was formed on it. After a sputtering time of 65 minutes, a resistive film having a film thickness of 200 nm was obtained. The obtained resistive film had a resistivity of $1\times10^{11}$ Ωcm.

The thus-produced Pt—Al mixture-oxidized film was subjected to the measurement of the average particle diameter of platinum particles dispersed in the medium of aluminum oxide through a TEM (transmission electron microscope), and showed an average particle diameter of 0.5 nm.

Example 19

A Pt—Al mixture target was set which had a composition ratio of 2 atomic % Pt to 98 atomic % Al, and a diameter of 8 inches. Under an oxygen gas flow rate of $O_2=100$ sccm and a sputtering pressure of 0.3 Pa, the above described Pt—Al mixture target was sputtered with high-frequency electrification power of 2,400 W.

A glass substrate was introduced into a film-forming chamber, and the film was formed on it. After a sputtering time of 60 minutes, a resistive film having a film thickness of 200 nm was obtained. The obtained resistive film had a resistivity of $1\times10^{11}$ Ωcm.

The thus-produced Pt—Al mixture-oxidized film was subjected to the measurement of the average particle diameter of platinum particles dispersed in the medium of aluminum oxide through a TEM (transmission electron microscope), and showed an average particle diameter of 0.6 nm.

Example 20

A Pt—Al mixture target was set which had a composition ratio of 30-atomic % Pt to 70 atomic % Al, and a diameter of 8 inches. Under an oxygen gas flow rate of $O_2=100$ sccm and a sputtering pressure of 1.0 Pa, the above described Pt—Al mixture target was sputtered with high-frequency electrification power of 2,400 W.

A glass substrate was introduced into a film-forming chamber, and the film was formed on it. After a sputtering time of 70 minutes, a resistive film having a thickness of 200 nm was obtained. The obtained resistive film had a resistivity of $1\times10^8$ Ωcm.

The thus-produced Pt—Al mixture-oxidized film was subjected to the measurement of the average particle diameter of platinum particles dispersed in the medium of aluminum oxide through a TEM (transmission electron microscope), and showed a diameter of 8 nm.

Example 21

A Pt—Al mixture target was set which had a composition ratio of 30 atomic % Pt to 70 atomic % Al, and a diameter of 8 inches. Under an oxygen gas flow rate of $O_2=100$ sccm and a sputtering pressure of 0.5 Pa, the above described Pt—Al mixture target was sputtered with high-frequency electrification power of 2,400 W.

A glass substrate was introduced into a film-forming chamber, and the film was formed on it. After a sputtering time of 65 minutes, a resistive film having a film thickness of 200 nm was obtained. The obtained resistive film had a resistivity of $1\times10^7$ Ωcm.

The thus-produced Pt—Al mixture-oxidized film was subjected to the measurement of the average particle diameter of platinum particles dispersed in the medium of aluminum oxide through a TEM (transmission electron microscope), and showed an average particle diameter of 9 nm.

Example 22

A Pt—Al mixture target was set which had a composition ratio of 30 atomic % Pt to 70 atomic % Al, and a diameter of 8 inches. Under an oxygen gas flow rate of $O_2$=100 sccm and a sputtering pressure of 0.3 Pa, the above described Pt—Al mixture target was sputtered with high-frequency electrification power of 2,400 W.

A glass substrate was introduced into a film-forming chamber, and the film was formed on it. After a sputtering time of 60 minutes, a resistive film having a film thickness of 200 nm was obtained. The obtained resistive film had a resistivity of $1 \times 10^6$ Ωcm.

The thus-produced Pt—Al mixture-oxidized film was subjected to the measurement of the average particle diameter of platinum particles dispersed in the medium of aluminum oxide through a TEM (transmission electron microscope), and showed an average particle diameter of 10 nm.

Example 23

A film was formed with the use of a Pt—Al mixture target having a composition ratio of 2 atomic % Pt to 98 atomic % Al, and a diameter of 8 inches. The film was formed at an oxygen/nitrogen mixed gas flow rate of $O_2$=2 sccm and $N_2$=98 sccm. The sputtering pressure was set to 1.0 Pa, and the electrification power to 2,400 W.

After a sputtering time of 35 minutes, a resistive film having a film thickness of 200 nm was obtained. The obtained resistive film had a resistivity of $2 \times 10^{12}$ Ωcm.

The thus-produced Pt—Al mixture-nitrided/oxidized film was subjected to the measurement of the average particle diameter of platinum particles dispersed in the medium of aluminum nitride and aluminum oxide through a TEM (transmission electron microscope), and showed an average particle diameter of 0.4 nm.

Example 24

A film was formed with the use of a Pt—Al mixture target having a composition ratio of 2 atomic % Pt to 98 atomic % Al, and a diameter of 8 inches. The film was formed at an oxygen/nitrogen mixed gas flow rate of $O_2$=2 sccm and $N_2$=98 sccm. The sputtering pressure was set to 0.5 Pa, and the electrification power to 2,400 W.

After a sputtering time of 30 minutes, a resistive film having a thickness of 200 nm was obtained. The obtained resistive film had a resistivity of $1 \times 10^{11}$ Ωcm.

The thus-produced Pt—Al mixture-nitrided/oxidized film was subjected to the measurement of the average particle diameter of platinum particles dispersed in the medium of aluminum nitride and aluminum oxide through a TEM (transmission electron microscope), and showed an average particle diameter of 0.5 nm.

Example 25

A film was formed with the use of a Pt—Al mixture target having a composition ratio of 2 atomic % Pt to 98 atomic % Al, and a diameter of 8 inches. The film was formed at an oxygen/nitrogen mixed gas flow rate of $O_2$=2 sccm and $N_2$=98 sccm. The sputtering pressure was set to 0.3 Pa, and the electrification power to 2,400 W.

The sputtering time was 25 minutes. Then, a resistive film having a film thickness of 200 nm was obtained. The obtained resistive film had a resistivity of $1 \times 10^{11}$ Ωcm.

The thus-produced Pt—Al mixture-nitrided/oxidized film was subjected to the measurement of the average particle diameter of platinum particles dispersed in the medium of aluminum nitride and aluminum oxide through a TEM (transmission electron microscope), and showed an average particle diameter of 0.6 nm.

Example 26

A film was formed with the use of a Pt—Al mixture target having a composition ratio of 30 atomic % Pt to 70 atomic % Al, and a diameter of 8 inches. The film was formed at an oxygen/nitrogen mixed gas flow rate of $O_2$=2 sccm and $N_2$=98 sccm. The sputtering pressure was set to 1.0 Pa, and the electrification power to 2,400 W.

After a sputtering time of 35 minutes, a resistive film having a film thickness of 200 nm was obtained. The obtained resistive film had a resistivity of $1 \times 10^5$ Ωcm.

The thus-produced Pt—Al mixture-nitrided/oxidized film was subjected to the measurement of the average particle diameter of platinum particles dispersed in the medium of aluminum nitride and aluminum oxide through a TEM (transmission electron microscope), and showed an average particle diameter of 9 nm.

Example 27

A film was formed with the use of a Pt—Al mixture target having a composition ratio of 30 atomic % Pt to 70 atomic % Al, and a diameter of 8 inches. The film was formed at an oxygen/nitrogen mixed gas flow rate of $O_2$=2 sccm and $N_2$=98 sccm. The sputtering pressure was set to 0.5 Pa, and the electrification power to 2,400 W.

After a sputtering time of 30 minutes, a resistive film having a thickness of 200 nm was obtained. The obtained resistive film had a resistivity of $1 \times 10^4$ Ωcm.

The thus-produced Pt—Al mixture-nitrided/oxidized film was subjected to the measurement of the average particle diameter of platinum particles dispersed in the medium of aluminum nitride and aluminum oxide through a TEM (transmission electron microscope), and showed an average particle diameter of 10 nm.

Example 28

A film was formed with the use of a Pt—Al mixture target having a composition ratio of 30 atomic % Pt to 70 atomic % Al, and a diameter of 8 inches. The film was formed at an oxygen/nitrogen mixed gas flow rate of $O_2$=2 sccm and $N_2$=98 sccm. The sputtering pressure was set to 0.3 Pa, and the electrification power to 2,400 W.

After a sputtering time of 25 minutes, a resistive film having a thickness of 200 nm was obtained. The obtained resistive film had a resistivity of $5 \times 10^3$ Ωcm.

The thus-produced Pt—Al mixture-nitrided/oxidized film was subjected to the measurement of the average particle diameter of platinum particles dispersed in the medium of aluminum nitride and aluminum oxide through a TEM (transmission electron microscope), and showed an average particle diameter of 11 nm.

A spacer substrate was prepared by forming each resistive film shown in the above described samples 5 to 28 as an antistatic film on a glass substrate, and was used as a spacer in a picture display unit using the surface conduction electron-emitting device, which is the present embodiment. The influence of the spacer on an image was evaluated by measuring the deviation of an electron beam ΔL.

A spacer provided with a resistive film having a resistivity ρ of $1\times10^4$ to $1\times10^{11}$ Ωcm and containing platinum particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing platinum particles with diameters in a range of 1 to 9 nm, showed a deviation of an electron beam ΔL of 1% or less (0.01 L or less) and a particularly adequate display image.

The results are shown in Table 4.

device, which is the present embodiment. The influence of the spacer on an image was evaluated by measuring the deviation of an electron beam ΔL.

A spacer provided with a resistive film having a resistivity ρ of $1\times10^4$ to $1\times10^{11}$ Ωcm and containing platinum particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing platinum particles with diameters in a range of 1 to 9 nm, showed a deviation of an electron beam ΔL of 1% or less (0.01 L or less) and a particularly adequate display image.

TABLE 4

| | Film type | TGT composition | Gas type | Sputtering pressure [Pa] | Resistivity [Ωcm] | Average particle diameter [nm] | Image evaluation |
|---|---|---|---|---|---|---|---|
| Example 5 | Pt—Al—N | Pt: 2% Al: 98% | $N_2$/Ar | 1.0 Pa | 2.E+09 | 0.4 | X |
| Example 6 | | | | 0.5 Pa | 1.E+09 | 0.5 | ○ |
| Example 7 | | | | 0.3 a | 8.E+08 | 0.6 | ○ |
| Example 8 | | Pt: 30% Al: 70% | | 1.0 Pa | 1.E+04 | 9 | ◉ |
| Example 9 | | | | 0.5 Pa | 1.E+04 | 10 | ○ |
| Example 10 | | | | 0.3 a | 1.E+03 | 11 | X |
| Example 11 | Pt—Al—N | Pt2% Al: 98% | $N_2$ | 1.0 Pa | 1.E+11 | 0.8 | ○ |
| Example 12 | | | | 0.5 Pa | 1.E+11 | 1 | ◉ |
| Example 13 | | | | 0.3 a | 8.E+10 | 2 | ◉ |
| Example 14 | | Pt: 30% Al: 70% | | 1.0 Pa | 1.E+04 | 9 | ◉ |
| Example 15 | | | | 0.5 Pa | 1.E+04 | 10 | ○ |
| Example 16 | | | | 0.3 a | 1.E+02 | 11 | X |
| Example 17 | Pt—Al—O | Pt: 2% Al: 98% | $O_2$ | 1.0 Pa | 5.E+11 | 0.4 | X |
| Example 18 | | | | 0.5 Pa | 1.E+11 | 0.5 | ○ |
| Example 19 | | | | 0.3 a | 1.E+11 | 0.6 | ○ |
| Example 20 | | Pt: 30% Al: 70% | | 1.0 Pa | 1.E+08 | 8 | ◉ |
| Example 21 | | | | 0.5 Pa | 1.E+07 | 9 | ◉ |
| Example 22 | | | | 0.3 a | 1.E+06 | 10 | ○ |
| Example 23 | Pt—Al—N—O | Pt: 2% Al: 98% | $N_2/O_2$ | 1.0 Pa | 2.E+12 | 0.4 | X |
| Example 24 | | | | 0.5 Pa | 1.E+11 | 0.5 | ○ |
| Example 25 | | | | 0.3 a | 1.E+11 | 0.6 | ○ |
| Example 26 | | Pt: 30% Al: 70% | | 1.0 Pa | 1.E+05 | 9 | ◉ |
| Example 27 | | | | 0.5 Pa | 1.E+04 | 10 | ○ |
| Example 28 | | | | 0.3 a | 5.E+03 | 11 | X |

Example 29

A film was formed with the use of a Pt—Ge mixture target prepared so as to have an adjusted composition ratio and a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 Pa to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of platinum particles in a medium was determined.

A spacer substrate was prepared by forming each resistive film on a glass substrate, and was used as a spacer in a picture display unit using a surface conduction electron-emitting The results are shown in Table 5.

TABLE 5

| | Film type | Gas type | Resistivity [Ωcm] | Average particle diameter [nm] | Image evaluation |
|---|---|---|---|---|---|
| Example 29 | Pt—Ge—N | $N_2$/Ar | 2.E+09 | 0.4 | X |
| | | | 1.E+09 | 0.5 | ○ |
| | | | 5.E+04 | 9 | ◉ |
| | Pt—Ge—N | $N_2$ | 1.E+11 | 0.5 | ○ |
| | | | 8.E+10 | 1 | ◉ |
| | | | 8.E+04 | 10 | ○ |
| | Pt—Ge—O | $O_2$ | 1.E+14 | 0.3 | X |
| | | | 1.E+08 | 9 | ◉ |
| | | | 1.E+07 | 10 | ○ |
| | Pt—Ge—N—O | $N_2/O_2$ | 1.E+11 | 0.6 | ○ |
| | | | 1.E+04 | 10 | ○ |
| | | | 5.E+03 | 11 | X |

Example 30

A film was formed using a Pt—Si mixture target prepared so as to have an adjusted composition ratio and a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of platinum particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing platinum particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing platinum particles with diameters in a range of 1 to 9 nm, showed a deviation of an electron beam ΔL of 1% or less (0.01 L or less) and a particularly adequate display image.

The results are shown in Table 6.

TABLE 6

| | Film type | Gas type | Resistivity [Ωcm] | Average particle diameter [nm] | Image evaluation |
|---|---|---|---|---|---|
| Example 30 | Pt—Si—N | N$_2$/Ar | 1.E+09 | 0.4 | X |
| | | | 5.E+08 | 0.5 | ○ |
| | | | 3.E+04 | 9 | ⊚ |
| | Pt—Si—N | N$_2$ | 1.E+11 | 0.5 | ○ |
| | | | 4.E+10 | 1 | ⊚ |
| | | | 4.E+04 | 10 | ○ |
| | Pt—Si—O | O$_2$ | 1.E+14 | 0.4 | X |
| | | | 1.E+08 | 9 | ⊚ |
| | | | 1.E+07 | 10 | ○ |
| | Pt—Si—N—O | N$_2$/O$_2$ | 5.E+11 | 0.4 | X |
| | | | 1.E+04 | 10 | ○ |
| | | | 3.E+03 | 11 | X |

Example 31

A film was formed with the use of a Pt—Mg mixture target prepared so as to have an adjusted composition ratio and a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of platinum particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing platinum particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing platinum particles with diameters in a range of 1 to 9 nm, showed a deviation of an electron beam ΔL of 1% or less (0.01 L or less) and a particularly adequate display image.

The results are shown in Table 7.

TABLE 7

| | Film type | Gas type | Resistivity [Ωcm] | Average particle diameter [nm] | Image evaluation |
|---|---|---|---|---|---|
| Example 31 | Pt—Mg—N | N$_2$/Ar | 1.E+11 | 0.3 | X |
| | | | 5.E+10 | 0.8 | ○ |
| | | | 1.E+04 | 8 | ⊚ |
| | Pt—Mg—N | N$_2$ | 1.E+11 | 0.5 | ○ |
| | | | 4.E+10 | 1 | ⊚ |
| | | | 1.E+04 | 10 | ○ |
| | Pt—Mg—O | O$_2$ | 1.E+14 | 0.2 | X |
| | | | 1.E+08 | 4 | ⊚ |
| | | | 1.E+07 | 5 | ⊚ |
| | Pt—Mg—N—O | N$_2$/O$_2$ | 6.E+05 | 8 | ⊚ |
| | | | 1.E+04 | 10 | ○ |
| | | | 3.E+03 | 12 | X |

Example 32

A film was formed with the use of an Au—Al mixture target having a composition ratio adjusted so as to comprise gold for a particle material, and aluminum nitride, aluminum oxide or aluminum nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of gold particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing gold particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing gold particles with diameters in a range of 1 to 9 nm, showed a deviation of an electron beam ΔL of 1% or less (0.01 L or less) and a particularly adequate display image.

The results are shown in Table 8.

TABLE 8

| | Film type | Gas type | Resistivity [Ωcm] | Average particle diameter [nm] | Image evaluation |
|---|---|---|---|---|---|
| Example 32 | Au—Al—N | $N_2$/Ar | 1.E+11 | 0.5 | ○ |
| | | | 1.E+09 | 1 | ⊚ |
| | | | 6.E+01 | 11 | X |
| | Au—Al—N | $N_2$ | 1.E+11 | 0.6 | ○ |
| | | | 1.E+04 | 9 | ⊚ |
| | | | 9.E+02 | 12 | X |
| | Au—Al—O | $O_2$ | 1.E+14 | 0.4 | X |
| | | | 1.E+08 | 11 | X |
| | | | 1.E+07 | 12 | X |
| | Au—Al—N—O | $N_2/O_2$ | 1.E+12 | 0.4 | X |
| | | | 1.E+04 | 10 | ○ |
| | | | 6.E+03 | 13 | X |

Example 33

A film was formed with the use of an Au—Ge mixture target having a composition ratio adjusted so as to comprise gold for a particle material, and germanium nitride, germanium oxide or germanium nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of gold particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing gold particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing gold particles with diameters in a range of 1 to 9 nm, showed a deviation of an electron beam ΔL of 1% or less (0.01 L or less) and a particularly adequate display image.

The results are shown in Table 9.

TABLE 9

| | Film type | Gas type | Resistivity [Ωcm] | Average particle diameter [nm] | Image evaluation |
|---|---|---|---|---|---|
| Example 33 | Au—Ge—N | $N_2$/Ar | 2.E+09 | 0.5 | ○ |
| | | | 1.E+09 | 1 | ⊚ |
| | | | 6.E+01 | 11 | X |
| | Au—Ge—N | $N_2$ | 1.E+11 | 0.5 | ○ |
| | | | 1.E+04 | 9 | ⊚ |
| | | | 9.E+02 | 12 | X |
| | Au—Ge—O | $O_2$ | 1.E+14 | 0.4 | X |
| | | | 1.E+08 | 11 | X |
| | | | 1.E+07 | 12 | X |
| | Au—Ge—N—O | $N_2/O_2$ | 1.E+11 | 0.7 | ○ |
| | | | 1.E+04 | 10 | ○ |
| | | | 6.E+03 | 13 | X |

Example 34

A film was formed with the use of an Au—Si mixture target having a composition ratio adjusted so as to comprise gold for a particle material, and silicon nitride, silicon oxide or silicon nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of gold particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing gold particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing gold particles with diameters in a range of 1 to 9 nm, showed a deviation of an electron beam ΔL of 1% or less (0.01 L or less) and a particularly adequate display image.

The results are shown in Table 10.

TABLE 10

| | Film type | Gas type | Resistivity [Ωcm] | Average particle diameter [nm] | Image evaluation |
|---|---|---|---|---|---|
| Example 34 | Au—Si—N | $N_2$/Ar | 1.E+09 | 0.5 | ○ |
| | | | 6.E+08 | 1 | ⊚ |
| | | | 3.E+01 | 11 | X |
| | Au—Si—N | $N_2$ | 1.E+11 | 0.5 | ○ |
| | | | 1.E+04 | 9 | ⊚ |
| | | | 4.E+01 | 12 | X |
| | Au—Si—O | $O_2$ | 1.E+14 | 0.4 | X |
| | | | 1.E+08 | 7 | ⊚ |
| | | | 1.E+07 | 8 | ⊚ |

TABLE 10-continued

| Film type | Gas type | Resistivity [Ωcm] | Average particle diameter [nm] | Image evaluation |
|---|---|---|---|---|
| Au—Si—N—O | N$_2$/O$_2$ | 1.E+11 | 0.7 | ○ |
| | | 1.E+05 | 8 | ◉ |
| | | 1.E+04 | 10 | ○ |

Example 35

A film was formed with the use of an Au—Mg mixture target having a composition ratio adjusted so as to comprise gold for a particle material, and magnesium nitride, magnesium oxide or magnesium nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of gold particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing gold particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing gold particles with diameters in a range of 1 to 9 nm, showed a deviation of an electron beam ΔL of 1% or less (0.01 L or less) and a particularly adequate display image.

The results are shown in Table 11.

TABLE 11

| | Film type | Gas type | Resistivity [Ωcm] | Average particle diameter [nm] | Image evaluation |
|---|---|---|---|---|---|
| Example 35 | Au—Mg—N | N$_2$/Ar | 1.E+11 | 0.4 | X |
| | | | 6.E+10 | 1 | ◉ |
| | | | 1.E+04 | 10 | ○ |

TABLE 11-continued

| Film type | Gas type | Resistivity [Ωcm] | Average particle diameter [nm] | Image evaluation |
|---|---|---|---|---|
| Au—Mg—N | N$_2$ | 1.E+11 | 0.5 | ○ |
| | | 4.E+10 | 0.7 | ○ |
| | | 2.E+01 | 12 | X |
| Au—Mg—O | O$_2$ | 1.E+14<< | 0.2 | X |
| | | 1.E+08 | 5 | ◉ |
| | | 1.E+07 | 6 | ◉ |
| Au—Mg—N—O | N$_2$/O$_2$ | 7.E+05 | 9 | ◉ |
| | | 1.E+04 | 10 | ○ |
| | | 3.E+03 | 14 | X |

Example 36

A film was formed with the use of an Ag—Al mixture target having a composition ratio adjusted so as to comprise silver for a particle material, and aluminum nitride, aluminum oxide or aluminum nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of silver particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing silver particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing silver particles with diameters in a range of 1 to 9 nm, showed a deviation of an electron beam ΔL of 1% or less (0.01 L or less) and a particularly adequate display image.

The results are shown in Table 12.

TABLE 12

| | Film type | Gas type | Resistivity [Ωcm] | Average particle diameter [nm] | Image evaluation |
|---|---|---|---|---|---|
| Example 36 | Ag—Al—N | $N_2$/Ar | 2.E+11 | 0.4 | X |
| | | | 2.E+09 | 0.7 | ○ |
| | | | 1.E+02 | 13 | X |
| | Ag—Al—N | $N_2$ | 1.E+11 | 0.5 | ○ |
| | | | 2.E+10 | 1 | ⊚ |
| | | | 2.E+03 | 14 | X |
| | Ag—Al—O | $O_2$ | 1.E+14 | 0.4 | X |
| | | | 2.E+08 | 13 | X |
| | | | 2.E+07 | 14 | X |
| | Ag—Al—N—O | $N_2$/$O_2$ | 2.E+12 | 0.4 | X |
| | | | 2.E+04 | 9 | ⊚ |
| | | | 1.E+04 | 10 | ○ |

Example 37

A film was formed with the use of an Ag—Ge mixture target having a composition ratio adjusted so as to comprise silver for a particle material, and germanium nitride, germanium oxide or germanium nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the power to 2,400 W.

The sputtering time was appropriately adjusted to obtain a film thickness of 200 nm.

The resistivities of these resistive films were measured. In addition, by using a TEM (transmission electron microscope), the average particle diameter of silver particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing silver particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing silver particles with diameters in a range of 1 to 9 nm, showed a deviation of an electron beam ΔL of 1% or less (0.01 L or less) and a particularly adequate display image.

The results are shown in Table 13.

TABLE 13

| | Film type | Gas type | Resistivity [Ωcm] | Average particle diameter [nm] | Image evaluation |
|---|---|---|---|---|---|
| Example 37 | Ag—Ge—N | $N_2$/Ar | 4.E+09 | 0.6 | ○ |
| | | | 2.E+09 | 1 | ⊚ |
| | | | 1.E+02 | 13 | X |
| | Ag—Ge—N | $N_2$ | 1.E+11 | 0.5 | ○ |
| | | | 5.E+04 | 9 | ⊚ |
| | | | 2.E+03 | 14 | X |
| | Ag—Ge—O | $O_2$ | 1.E+14 | 0.4 | X |
| | | | 2.E+08 | 13 | X |
| | | | 2.E+07 | 14 | X |
| | Ag—Ge—N—O | $N_2$/$O_2$ | 1.E+11 | 0.9 | ○ |
| | | | 1.E+04 | 10 | ○ |
| | | | 1.E+03 | 16 | X |

Example 38

A film was formed with the use of an Ag—Si mixture target having a composition ratio adjusted so as to comprise silver for a particle material, and silicon nitride, silicon oxide or silicon nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of silver particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing silver particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing silver particles with diameters in a range of 1 to 9 nm, showed a deviation of an electron beam ΔL of 1% or less (0.01 L or less) and a particularly adequate display image.

The results are shown in Table 14.

Example 39

A film was formed with the use of an Ag—Mg mixture target having a composition ratio adjusted so as to comprise silver for a particle material, and magnesium nitride, magnesium oxide or magnesium nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of silver particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing silver particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing silver particles with diameters in a range of 1 to 9 nm, showed a deviation of an electron beam ΔL of 1% or less (0.01 L or less) and a particularly adequate display image.

TABLE 14

| | Film type | Gas type | Resistivity [Ωcm] | Average particle diameter [nm] | Image evaluation |
|---|---|---|---|---|---|
| Example 38 | Ag—Si—N | N$_2$/Ar | 2.E+09 | 0.6 | ○ |
| | | | 1.E+09 | 0.7 | ○ |
| | | | 6.E+01 | 13 | X |
| | Ag—Si—N | N$_2$ | 1.E+11 | 0.5 | ○ |
| | | | 8.E+10 | 1 | ⊚ |
| | | | 8.E+01 | 14 | X |
| | Ag—Si—O | O$_2$ | 1.E+14<< | 0.7 | X |
| | | | 2.E+08 | 8 | ⊚ |
| | | | 2.E+07 | 9 | ⊚ |
| | Ag—Si—N—O | N$_2$/O$_2$ | 1.E+11 | 0.9 | ○ |
| | | | 1.E+04 | 10 | ○ |
| | | | 2.E+04 | 11 | X |

The results are shown in Table 15.

TABLE 15

|  | Film type | Gas type | Resistivity [Ωcm] | Average particle diameter [nm] | Image evaluation |
|---|---|---|---|---|---|
| Example 39 | Ag—Mg—N | $N_2/Ar$ | 2.E+11 | 0.4 | X |
|  |  |  | 1.E+11 | 1 | ◉ |
|  |  |  | 1.E+04 | 12 | X |
|  | Ag—Mg—N | $N_2$ | 1.E+11 | 0.5 | ○ |
|  |  |  | 8.E+10 | 0.9 | ○ |
|  |  |  | 4.E+01 | 14 | X |
|  | Ag—Mg—O | $O_2$ | 1.E+14<< | 0.3 | X |
|  |  |  | 2.E+08 | 6 | ◉ |
|  |  |  | 2.E+07 | 7 | ◉ |
|  | Ag—Mg—N—O | $N_2/O_2$ | 1.E+06 | 9 | ◉ |
|  |  |  | 1.E+04 | 10 | ○ |
|  |  |  | 6.E+03 | 17 | X |

Example 40

A film was formed with the use of a Ge—Al mixture target having a composition ratio adjusted so as to comprise germanium for a particle material, and aluminum nitride, aluminum oxide or aluminum nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of germanium particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1 \times 10^4$ to $1 \times 10^{11}$ Ωcm and containing germanium particles with diameters in a range of 0.5 to 10 nm, showed a deviation of an electron beam ΔL of 3% or less (0.03 L or less) and an adequate display image.

A spacer provided with a resistive film having a resistivity ρ of $1 \times 10^4$ to $1 \times 10^{11}$ Ωcm and containing germanium particles with diameters in a range of 1 to 9 nm, showed a deviation of an electron beam ΔL of 1% or less (0.01 L or less) and a particularly adequate display image.

The results are shown in Table 16.

TABLE 16

|  | Film type | Gas type | Resistivity [Ωcm] | Average particle diameter [nm] | Image evaluation |
|---|---|---|---|---|---|
| Example 40 | Ge—Al—N | $N_2/Ar$ | 4.E+11 | 0.7 | ○ |
|  |  |  | 4.E+09 | 1 | ◉ |
|  |  |  | 2.E+02 | 16 | X |
|  | Ge—Al—N | $N_2$ | 1.E+11 | 0.5 | ○ |
|  |  |  | 4.E+04 | 9 | ◉ |
|  |  |  | 3.E+03 | 17 | X |
|  | Ge—Al—O | $O_2$ | 1.E+14<< | 0.9 | X |
|  |  |  | 4.E+08 | 16 | X |
|  |  |  | 4.E+07 | 17 | X |
|  | Ge—Al—N—O | $N_2/O_2$ | 1.E+11 | 1 | ◉ |
|  |  |  | 1.E+04 | 10 | ○ |
|  |  |  | 2.E+04 | 12 | X |

Example 41

A film was formed with the use of a Ge—Si mixture target having a composition ratio adjusted so as to comprise germanium for a particle material, and silicon nitride, silicon oxide or silicon nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of germanium particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity $\rho$ of $1 \times 10^4$ to $1 \times 10^{11}$ Ωcm and containing germanium particles with diameters in a range of 0.5 to 10 nm, showed a deviation of an electron beam ΔL of 3% or less (0.03 L or less) and an adequate display image.

A spacer provided with a resistive film having a resistivity $\rho$ of $1 \times 10^4$ to $1 \times 10^{11}$ Ωcm and containing germanium particles with diameters in a range of 1 to 9 nm, showed a deviation of an electron beam ΔL of 1% or less (0.01 L or less) and a particularly adequate display image.

The results are shown in Table 17.

TABLE 17

|  | Film type | Gas type | Resistivity [Ωcm] | Average particle diameter [nm] | Image evaluation |
|---|---|---|---|---|---|
| Example 41 | Ge—Si—N | N$_2$/Ar | 4.E+09 | 0.7 | ○ |
|  |  |  | 2.E+09 | 0.9 | ○ |
|  |  |  | 1.E+02 | 16 | X |
|  | Ge—Si—N | N$_2$ | 1.E+11 | 0.5 | ○ |
|  |  |  | 2.E+11 | 1 | ◎ |
|  |  |  | 2.E+02 | 17 | X |
|  | Ge—Si—O | O$_2$ | 1.E+14 | 0.4 | X |
|  |  |  | 4.E+08 | 9 | ◎ |
|  |  |  | 4.E+07 | 11 | X |
|  | Ge—Si—N—O | N$_2$/O$_2$ | 1.E+11 | 1 | ◎ |
|  |  |  | 1.E+04 | 10 | ○ |
|  |  |  | 4.E+04 | 13 | X |

Example 42

A film was formed with the use of a Ge—Mg mixture target having a composition ratio adjusted so as to comprise germanium for a particle material, and magnesium nitride, magnesium oxide or magnesium nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of germanium particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity $\rho$ of $1 \times 10^4$ to $1 \times 10^{11}$ Ωcm and containing germanium particles with diameters in a range of 0.5 to 10 nm, showed a deviation of an electron beam ΔL of 3% or less (0.03 L or less) and an adequate display image.

A spacer provided with a resistive film having a resistivity $\rho$ of $1 \times 10^4$ to $1 \times 10^{11}$ Ωcm and containing germanium particles with diameters in a range of 1 to 9 nm, showed a deviation of an electron beam ΔL of 1% or less (0.01 L or less) and a particularly adequate display image.

The results are shown in Table 18.

TABLE 18

|  | Film type | Gas type | Resistivity [Ωcm] | Average particle diameter [nm] | Image evaluation |
|---|---|---|---|---|---|
| Example 42 | Ge—Mg—N | N$_2$/Ar | 1.E+11 | 0.5 | ○ |
|  |  |  | 2.E+10 | 1 | ◎ |
|  |  |  | 2.E+04 | 14 | X |
|  | Ge—Mg—N | N$_2$ | 1.E+11 | 0.5 | ○ |
|  |  |  | 2.E+11 | 1 | ◎ |
|  |  |  | 8.E+01 | 17 | X |
|  | Ge—Mg—O | O$_2$ | 1.E+14<< | 0.3 | X |
|  |  |  | 4.E+08 | 7 | ◎ |
|  |  |  | 4.E+07 | 9 | ◎ |
|  | Ge—Mg—N—O | N$_2$/O$_2$ | 2.E+06 | 10 | ○ |
|  |  |  | 2.E+04 | 10 | ○ |
|  |  |  | 1.E+02 | 20 | X |

Example 43

A film was formed with the use of a Si—Al mixture target having a composition ratio adjusted so as to comprise silicon for a particle material, and aluminum nitride, aluminum oxide or aluminum nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of silicon particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing silicon particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing silicon particles with diameters in a range of 1 to 9 nm, showed a deviation of an electron beam ΔL of 1% or less (0.01 L or less) and a particularly adequate display image.

The results are shown in Table 19.

TABLE 19

| | Film type | Gas type | Resistivity [Ωcm] | Average particle diameter [nm] | Image evaluation |
|---|---|---|---|---|---|
| Example 43 | Si—Al—N | N$_2$/Ar | 1.E+11 | 0.8 | ○ |
| | | | 9.E+09 | 1 | ◎ |
| | | | 5.E+02 | 19 | X |

TABLE 19-continued

| Film type | Gas type | Resistivity [Ωcm] | Average particle diameter [nm] | Image evaluation |
|---|---|---|---|---|
| Si—Al—N | N$_2$ | 1.E+11 | 0.5 | ○ |
| | | 9.E+04 | 9 | ◎ |
| | | 7.E+03 | 21 | X |
| Si—Al—O | O$_2$ | 1.E+14 | 0.4 | X |
| | | 9.E+08 | 19 | X |
| | | 9.E+07 | 21 | X |
| Si—Al—N—O | N$_2$/O$_2$ | 1.E+11 | 1 | ◎ |
| | | 1.E+04 | 10 | ○ |
| | | 5.E+04 | 14 | X |

Example 44

A film was formed with the use of an Si—Ge mixture target having a composition ratio adjusted so as to comprise silicon for a particle material, and germanium nitride, germanium oxide or germanium nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of silicon particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam ΔL.

A spacer provided with a resistive film having a resistivity ρ of $1\times10^4$ to $1\times10^{11}$ Ωcm and containing silicon particles with diameters in a range of 0.5 to 10 nm, showed a deviation of an electron beam ΔL of 3% or less (0.03 L or less) and an adequate display image.

A spacer provided with a resistive film having a resistivity ρ of $1\times10^4$ to $1\times10^{11}$ Ωcm and containing silicon particles with diameters in a range of 1 to 9 nm, showed a deviation of an electron beam ΔL of 1% or less (0.01 L or less) and a particularly adequate display image.

The results are shown in Table 20.

TABLE 20

| | Film type | Gas type | Resistivity [Ωcm] | Average particle diameter [nm] | Image evaluation |
|---|---|---|---|---|---|
| Example 44 | Si—Ge—N | N$_2$/Ar | 2.E+10 | 0.8 | ○ |
| | | | 9.E+09 | 1 | ◎ |
| | | | 5.E+02 | 19 | X |
| | Si—Ge—N | N$_2$ | 5.E+11 | 0.1 | X |
| | | | 1.E+11 | 0.5 | ○ |
| | | | 7.E+03 | 21 | X |
| | Si—Ge—O | O$_2$ | 1.E+14 | 0.4 | X |
| | | | 9.E+08 | 19 | X |
| | | | 9.E+07 | 21 | X |
| | Si—Ge—N—O | N$_2$/O$_2$ | 9.E+10 | 9 | ◎ |
| | | | 1.E+04 | 10 | ○ |
| | | | 5.E+03 | 23 | X |

Example 45

A film was formed with the use of a Si—Mg mixture target having a composition ratio adjusted so as to comprise silicon for a particle material, and magnesium nitride, magnesium oxide or magnesium nitride/oxide for a medium, and having a diameter of 8 inches.

The following four kinds of gas types were used in order to form the film: a nitrogen/Ar mixed gas, nitrogen gas, oxygen gas and an oxygen/nitrogen mixed gas. The sputtering pressure was set to 0.3 to 1.5 Pa, and the electrification power to 2,400 W.

The sputtering time was appropriately adjusted to obtain a film thickness of 200 nm.

The resistivities of these resistive films were measured. In addition, by using a TEM (transmission electron microscope), the average particle diameter of silicon particles in a medium was determined.

A spacer substrate was prepared by forming each resistive film on a glass substrate, and was used as a spacer in a picture display unit using the surface conduction electron-emitting device, which is the present embodiment.

The influence of the spacer on an image was evaluated by measuring the deviation of an electron beam $\Delta L$.

A spacer provided with a resistive film having a resistivity $\rho$ of $1\times10^4$ to $1\times10^{11}$ $\Omega$cm and containing silicon particles with diameters in a range of 0.5 to 10 nm, showed a deviation of an electron beam $\Delta L$ of 3% or less (0.03 L or less) and an adequate display image.

A spacer provided with a resistive film having a resistivity $\rho$ of $1\times10^4$ to $1\times10^{11}$ $\Omega$cm and containing silicon particles with diameters in a range of 1 to 9 nm, showed a deviation of an electron beam $\Delta L$ of 1% or less (0.01 L or less) and a particularly adequate display image.

The results are shown in Table 21.

TABLE 21

| | Film type | Gas type | Resistivity [Ωcm] | Average particle diameter [nm] | Image evaluation |
|---|---|---|---|---|---|
| Example 45 | Si—Mg—N | N₂/Ar | 2.E+10 | 0.6 | ○ |
| | | | 9.E+09 | 2 | ◎ |
| | | | 5.E+04 | 17 | X |
| | Si—Mg—N | N₂ | 1.E+11 | 0.5 | ○ |
| | | | 4.E+11 | 1 | ◎ |
| | | | 2.E+02 | 21 | X |
| | Si—Mg—O | O₂ | 1.E+14<< | 0.4 | X |
| | | | 9.E+08 | 8 | ◎ |
| | | | 9.E+07 | 10 | ○ |
| | Si—Mg—N—O | N₂/O₂ | 6.E+06 | 9 | ◎ |
| | | | 1.E+04 | 10 | ○ |
| | | | 1.E+00 | 24 | X |

As described above, the present invention can provide the resistive film which is superior controllability for a resistivity value, stability and reproducibility, has adequate temperature characteristics of resistance, and is suitable for an antistatic film.

In addition, the present invention can provide a picture display unit having the effect of reducing the instability of a display image, which originates from a temperature distribution in an airtight vessel caused by a temperature difference between a pair of substrates that compose the airtight vessel, and having superior display performance.

This application claims priority from Japanese Patent Application No. 2004-014469 filed on Jan. 22, 2004, which is hereby incorporated by reference herein.

What is claimed is:

1. A picture display unit provided with an airtight vessel having a first substrate with an electron source arranged thereon, and a second substrate with an image display member arranged thereon so as to face the electron source, and a spacer arranged between the first and second substrates in the airtight vessel, wherein the spacer has an antistatic film, the antistatic film comprising: a plurality of semiconductor particles with particle diameters of 0.5 to 10 nm dispersed in a medium containing a nitride, wherein a surface resistance of the film is in a region of $5\times10^8\Omega/\square \sim 5\times10^{15}\Omega/\square$, such that deviation of an electron beam in an image influenced by the film is 3% or less.

2. The antistatic film according to claim 1, wherein each semiconductor particle is a germanium particle, and the nitride is silicon nitride.

3. The antistatic film according to claim 1, wherein a content of each semiconductor particle is 0.1 to 10 atomic %.

4. The antistatic film according to claim 1, wherein at least one particle diameter is 1.0 to 9.0 nm.

5. The antistatic film according to claim 1, wherein a resistivity of at least part of the film is $\rho=1\times10^4$ to $1\times10^{11}$ $\Omega$cm.

6. An electron-generating device with an electron source in an airtight vessel, comprising the antistatic film according to claim 1, in the airtight vessel.

7. A picture display unit provided with an airtight vessel having a first substrate with an electron source arranged thereon, and a second substrate with an image display member arranged thereon so as to face the electron source, and a spacer arranged between the first and second substrates in the airtight vessel, wherein the spacer has an antistatic film, the antistatic film comprising: a plurality of semiconductor particles with particle diameters of 0.5 to 10 nm dispersed in a medium containing an oxide, wherein a surface resistance of the film is in a region of $5\times10^8\Omega/\square \sim 5\times10^{15}\Omega/\square$, such that deviation of an electron beam in an image influenced by the film is 3% or less.

8. The antistatic film according to claim 7, wherein each semiconductor particle is a germanium particle, and the oxide is silicon oxide.

9. The antistatic film according to claim 7, wherein a content of each semiconductor particle is 0.1 to 10 atomic %.

10. The antistatic film according to claim 7, wherein at least one particle diameter is 1.0 to 9.0 nm.

11. The antistatic film according to claim 7, wherein a resistivity of at least part of the film is $\rho=1\times10^4$ to $1\times10^{11}$ $\Omega$cm.

12. An electron-generating device with an electron source in an airtight vessel, comprising the antistatic film according to claim 7, in the airtight vessel.

13. A picture display unit provided with an airtight vessel having a first substrate with an electron source arranged thereon, and a second substrate with an image display member arranged thereon so as to face the electron source, and a spacer arranged between the first and second substrates in the airtight vessel, wherein the spacer has an antistatic film, the antistatic film comprising: a plurality of semiconductor particles with particle diameters of 0.5 to 10 nm dispersed in a medium containing a nitride and an oxide, wherein a surface resistance of the film is in a region of $5\times10^8 \Omega/\square \sim 5\times10^{15} \Omega/\square$, such that deviation of an electron beam in an image influenced by the film is 3% or less.

14. The antistatic film according to claim 13, wherein each semiconductor particle is a germanium particle, the nitride is silicon nitride, and the oxide is silicon oxide.

15. The antistatic film according to claim 13, wherein a content of each semiconductor particle is 0.1 to 10 atomic %.

16. The antistatic film according to claim 13, wherein at least one particle diameter is 1.0 to 9.0 nm.

17. The antistatic film according to claim 13, wherein a resistivity of at least part of the film is $\rho=1\times10^4$ to $1\times10^{11}$ $\Omega$cm.

18. An electron-generating device with an electron source in an airtight vessel, comprising the antistatic film according to claim 13, in the airtight vessel.

19. A picture display unit comprising:
an airtight vessel;
an electron source;
an image display member arranged so as to face the electron source; and
a spacer arranged in the airtight vessel,
wherein the spacer comprises:
a medium containing a nitride and an oxide, and
a plurality of conductor particles with particle diameters of 0.5 to 10 nm dispersed in the medium containing the nitride and the oxide, and
wherein a surface resistance of the spacer is in a region of $5\times10^8 \Omega/\square \sim 5\times10^{15} \Omega/\square$, such that deviation of an electron beam in an image influenced by the spacer is 3% or less.

20. The picture display unit according to claim 19, wherein each conductor particle is a platinum particle, the nitride is aluminum nitride, and the oxide is aluminum oxide.

21. The picture display unit according to claim 19, wherein each conductor particle is a gold particle, the nitride is aluminum nitride, and the oxide is aluminum oxide.

22. The picture display unit according to claim 19, wherein each conductor particle is a silver particle, the nitride is aluminum nitride, and the oxide is aluminum oxide.

23. The picture display unit according to claim 19, wherein at least one of the particle diameters is 1.0 to 9.0 nm.

24. The picture display unit according to claim 19, wherein a content of each conductor particle is 0.1 to 10 atomic %.

25. A picture display unit comprising:
an airtight vessel;
an electron source;
an image display member arranged so as to face the electron source; and
a spacer arranged in the airtight vessel,
wherein the spacer has a film on a surface of the spacer, and the film comprises:
a medium containing a nitride and an oxide, and
a plurality of conductor particles with particle diameters of 0.5 to 10 nm dispersed in a medium containing the nitride and the oxide, and
wherein a surface resistance of the spacer is in a region of $5\times10^8 \Omega/\square \sim 5\times10^{15} \Omega/\square$, such that deviation of an electron beam in an image influenced by the spacer is 3% or less.

26. The picture display unit according to claim 25, wherein a resistivity of at least part of the film is $\rho=1\times10^4$ to $1\times10^{11}$ $\Omega$cm.

27. The picture display unit according to claim 25, wherein each conductor particle is a platinum particle, the nitride is aluminum nitride, and the oxide is aluminum oxide.

28. The picture display unit according to claim 25, wherein each conductor particle is a gold particle, the nitride is aluminum nitride, and the oxide is aluminum oxide.

29. The picture display unit according to claim 25, wherein each conductor particle is a silver particle, the nitride is aluminum nitride, and the oxide is aluminum oxide.

30. The picture display unit according to claim 25, wherein at least one of the particle diameters is 1.0 to 9.0 nm.

31. The picture display unit according to claim 25, wherein a content of each conductor particle is 0.1 to 10 atomic %.

32. A picture display unit comprising:
an airtight vessel;
an electron source;
an image display member arranged so as to face the electron source; and
a spacer arranged in the airtight vessel,
wherein the spacer comprises:
a medium containing a nitride and an oxide, and
a plurality of conductor particles with particle diameters of 1 to 9 nm dispersed in the medium containing the nitride and the oxide, and
wherein a surface resistance of the spacer is in a region of $5\times10^8 \Omega/\square \sim 5\times10^{15} \Omega/\square$, such that deviation of an electron beam in an image influenced by the spacer is 3% or less.

33. The picture display unit according to claim 32, wherein a content of each conductor particle is 0.1 to 10 atomic %.

34. A picture display unit comprising:
an airtight vessel;
an electron source; an image display member arranged so as to face the electron source; and a spacer arranged in the airtight vessel,
wherein the spacer has a film on a surface of the spacer, and the film comprises:
a medium containing a nitride and an oxide, and
a plurality of conductor particles with particle diameters of 1 to 9 nm dispersed in a medium containing the nitride and the oxide, and
wherein a surface resistance of the spacer is in a region of $5\times10^8 \Omega/\square \sim 5\times10^{15} \Omega/\square$, such that deviation of an electron beam in an image influenced by the spacer is 3% or less.

35. The picture display unit according to claim 34, wherein a content of each conductor particle is 0.1 to 10 atomic %.

* * * * *